United States Patent
Hamano et al.

(10) Patent No.: US 9,646,862 B2
(45) Date of Patent: May 9, 2017

(54) SUBSTRATE PROCESSING APPARATUS, METHOD OF MANUFACTURING SEMICONDUCTOR DEVICE AND NON-TRANSITORY COMPUTER-READABLE RECORDING MEDIUM

(71) Applicant: Hitachi Kokusai Electric Inc., Tokyo (JP)

(72) Inventors: Katsuyoshi Hamano, Toyama (JP); Atsushi Umekawa, Toyama (JP); Takuya Joda, Toyama (JP); Akinori Ishii, Toyama (JP); Masahisa Okuno, Toyama (JP)

(73) Assignee: Hitachi Kokusai Electric, Inc., Tokyo (JP)

( * ) Notice: Subject to any disclaimer, the term of this patent is extended or adjusted under 35 U.S.C. 154(b) by 69 days.

(21) Appl. No.: 14/614,625

(22) Filed: Feb. 5, 2015

(65) Prior Publication Data
US 2015/0147894 A1    May 28, 2015

Related U.S. Application Data

(63) Continuation of application No. PCT/JP2013/074117, filed on Sep. 6, 2013.

(30) Foreign Application Priority Data

Sep. 6, 2012 (JP) ................................ 2012-195756
Sep. 20, 2012 (JP) ................................ 2012-207603
Sep. 21, 2012 (JP) ................................ 2012-207748

(51) Int. Cl.
*H01L 21/00* (2006.01)
*H01L 21/67* (2006.01)
*H01L 21/687* (2006.01)
*H01L 21/268* (2006.01)

(52) U.S. Cl.
CPC ...... *H01L 21/67115* (2013.01); *H01L 21/268* (2013.01); *H01L 21/67126* (2013.01); *H01L 21/68735* (2013.01)

(58) Field of Classification Search
CPC .............. H01L 21/6711; H01L 21/268; H01L 21/67126; H01L 21/68735
USPC ......................................................... 438/795
See application file for complete search history.

(56) References Cited

U.S. PATENT DOCUMENTS

| | | | | |
|---|---|---|---|---|
| 5,556,475 A | * | 9/1996 | Besen | .................... C23C 16/511 118/723 E |
| 6,123,791 A | * | 9/2000 | Han | ...................... H01J 37/321 118/723 AN |
| 9,337,067 B2 | * | 5/2016 | Roy | .................. H01L 21/67109 |

(Continued)

*Primary Examiner* — Xinning Niu
*Assistant Examiner* — Vu A Vu
(74) *Attorney, Agent, or Firm* — Edell, Shapiro & Finnan LLC

(57) ABSTRACT

Heating within a plane of a substrate may be uniform while a thermal budget is decreased. A substrate processing apparatus includes a process chamber configured to accommodate a substrate; a substrate mounting unit installed in the process chamber and configured to have the substrate placed thereon; an electromagnetic wave supply unit configured to supply an electromagnetic wave to the substrate placed on the substrate mounting unit; and a choke groove formed on a side surface of the substrate mounting unit.

15 Claims, 21 Drawing Sheets

(56) References Cited

U.S. PATENT DOCUMENTS

2006/0075972 A1\* 4/2006 Nakashima ......... C23C 16/4584
  118/729
2013/0048489 A1\* 2/2013 Yamaguchi ......... C23C 14/0068
  204/192.15

\* cited by examiner

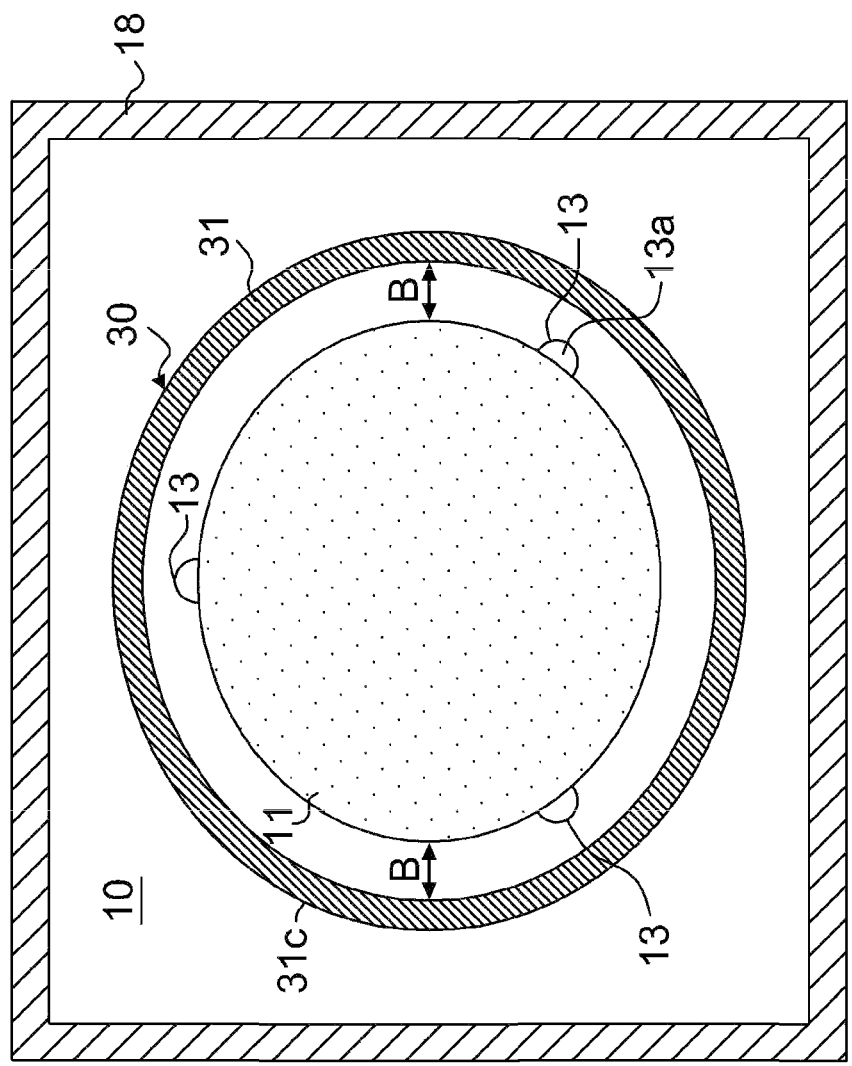

SUBSTRATE PROCESSING APPARATUS, METHOD OF MANUFACTURING SEMICONDUCTOR DEVICE AND NON-TRANSITORY COMPUTER-READABLE RECORDING MEDIUM

CROSS REFERENCE TO RELATED APPLICATIONS

This application is a continuation of International Application No. PCT/JP2013/074117, filed on Sep. 6, 2013, entitled "Substrate Processing Device, Semiconductor-Device Manufacturing Method, and Recording Medium," which claims priority under 35 U.S.C. §119 to Japanese Application No. JP 2012-207748 filed on Sep. 21, 2012, Japanese Application No. JP 2012-207603 filed on Sep. 20, 2012, and Japanese Application No. JP 2012-195756 filed on Sep. 6, 2012, the entire contents of which are hereby incorporated by reference.

FIELD OF THE INVENTION

The present invention relates to a technique for processing a substrate by heating the substrate.

BACKGROUND

As one of semiconductor manufacturing processes, for example, annealing may be performed to heat a substrate present in a process chamber using a heating mechanism such as a heater so as to remove impurities from a thin film formed on a surface of the substrate. Recently, more miniaturization of semiconductor devices results in a shallow junction, and thus a lower thermal budget (thermal history) is required. However, when a substrate is heated using the heating mechanism, the whole substrate is heated to a high temperature and it may thus be difficult to decrease the thermal budget. A technique of heating a substrate present in a process chamber by radiating electromagnetic waves such as microwaves to the substrate has been introduced.

A thermal budget may be lowered by heating a substrate by radiating electromagnetic waves to the substrate. However, when the substrate is heated using the electromagnetic waves, heating by the electromagnetic waves may not be uniform within a plane of the substrate. That is, the electromagnetic waves are radiated to the substrate in the process chamber, for example, via a waveguide opening formed in an upper wall of the process chamber. In general, the area of the waveguide opening is less than that of a processed surface of the substrate. The electromagnetic waves do not spread (diffuse) to a great extent after they are radiated via the waveguide opening. Thus, as the substrate is distant from a region opposite the waveguide opening, the amount of radiated electromagnetic waves may decrease. As a result, the electromagnetic waves cannot be radiated to the substrate to be uniformly distributed within a plane of the substrate, thereby preventing uniform heating within the plane of the substrate.

SUMMARY

It is an object of the present invention to provide a technique capable of uniform heating within a plane of a substrate while decreasing a thermal budget.

According to one aspect of the present invention, there is provided a structure including a process chamber configured to accommodate a substrate; a substrate mounting unit installed in the process chamber and configured to have the substrate placed thereon; an electromagnetic wave supply unit configured to supply an electromagnetic wave to the substrate placed on the substrate mounting unit; and a choke groove formed on a side surface of the substrate mounting unit.

BRIEF DESCRIPTION OF THE DRAWINGS

FIGS. 17A and 17B are diagrams illustrating a substrate processing apparatus according to the third embodiment of the present invention, wherein FIG. 17A illustrates a vertical sectional view of a substrate support unit and FIG. 17B illustrates a cross-sectional view taken along the line A-A of FIG. 17A;

DETAILED DESCRIPTION

First Embodiment

Figure 1:
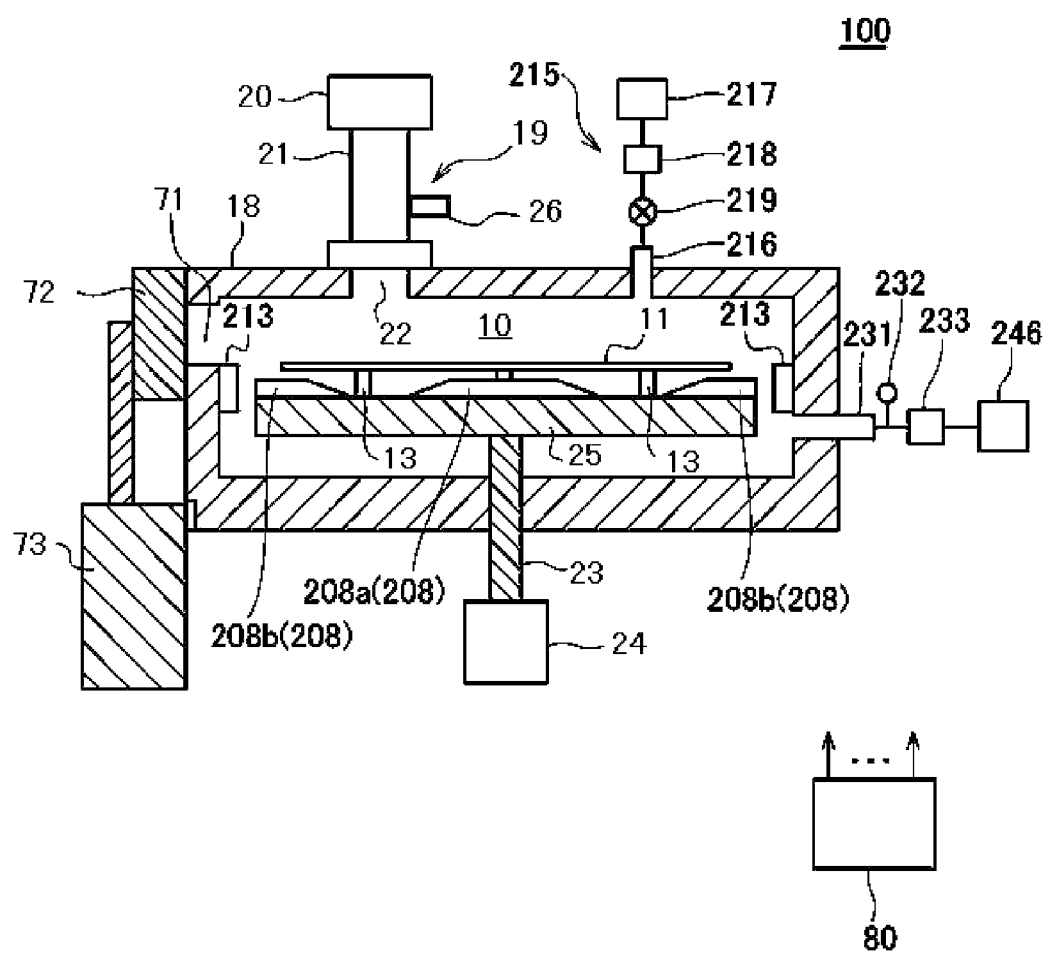
FIG. 1 is a vertical sectional view of a process chamber included in a substrate processing apparatus according to a first embodiment of the present invention.

A first embodiment of the present invention will be described with reference to FIG. 1 below.

(1) Structure of Process Chamber

The structure of a process chamber 10 included in a substrate processing apparatus 100 according to the first embodiment of the present invention will be described with reference to FIG. 1 below. FIG. 1 is a vertical sectional view of the process chamber 10 included in the substrate processing apparatus 100 according to the first embodiment of the present invention.
Process Chamber Referring to FIG. 1, the process chamber 10 includes a process container 18 which is a cylindrical airtight container. The process container 18 is configured to efficiently block electromagnetic waves radiated by an electromagnetic wave radiation unit 19 which will be described below so that an external environment or another substrate processing apparatus 100 may not be negatively influenced by the electromagnetic waves. The process container 18 is formed, for example, of a metal material such as aluminum (Al) or stainless steel (SUS).

A gate valve 72 serving as a gate valve is installed at a sidewall of the process chamber 18. The gate valve 72 is configured to be opened/closed by a gate valve driving unit 73. That is, when the gate valve 72 is opened by the gate valve driving unit 73, a wafer 11 formed of, for example, silicon and serving as a substrate may be loaded into the process chamber 10 from a transfer chamber via a transfer mechanism or unloaded from the process chamber 10 to the transfer chamber. When the gate valve 72 is closed by the gate valve driving unit 73, the inside of the process chamber 10 may be air-tightly blocked.
Electromagnetic Wave Radiation Unit The electromagnetic wave radiation unit 19 that radiates electromagnetic waves such as microwaves to the wafer 11 in the process chamber 10 is installed on the process container 18. The electromagnetic wave radiation unit 19 is air-tightly installed in a waveguide opening 22 that is open in an upper wall of the process container 18. The waveguide opening 22 is installed opposite at least a portion of a processed surface of the wafer 11 supported by a plurality of substrate support mechanisms 13 which will be described below. In addition, the waveguide opening 22 is installed in such a manner that a central position on the waveguide opening 22 is dislocated from a position facing a central position on the wafer 11. That is, in the present embodiment, when the wafer 11 having, for example, a diameter of 300 mm is used, the waveguide opening 22 is installed in such a manner that the central position on the waveguide opening 22 is spaced 75 mm from the position facing the central position on the wafer 11.

In the electromagnetic wave radiation unit 19, an electromagnetic wave generator 20 and a waveguide 21 are sequentially installed from the upstream end. The electromagnetic wave generator 20 is configured to generate, for example, fixed-frequency microwaves or variable-frequency microwaves. A microtron, a klystron, a gyrotron, etc. may be used as the electromagnetic wave generator 20. Electromagnetic waves generated by the electromagnetic wave generator 20 are radiated to the wafer 11 through a surface (processed surface) of the wafer 11 via the waveguide 21 and the waveguide opening 22. When the electromagnetic waves radiated to the wafer 11 are absorbed by the wafer 11, the wafer 11 is dielectrically heated by the electromagnetic waves.

The electromagnetic wave radiation unit 19 mainly includes the waveguide 21 and the waveguide opening 22. The electromagnetic wave generator 20 may be further included in the electromagnetic wave radiation unit 19.

A controller 80 which will be described below is electrically connected to the electromagnetic wave radiation unit 19. The controller 80 is configured to control the electromagnetic wave radiation unit 19 to radiate electromagnetic waves to the wafer 11 at a predetermined timing.

Figure 2:
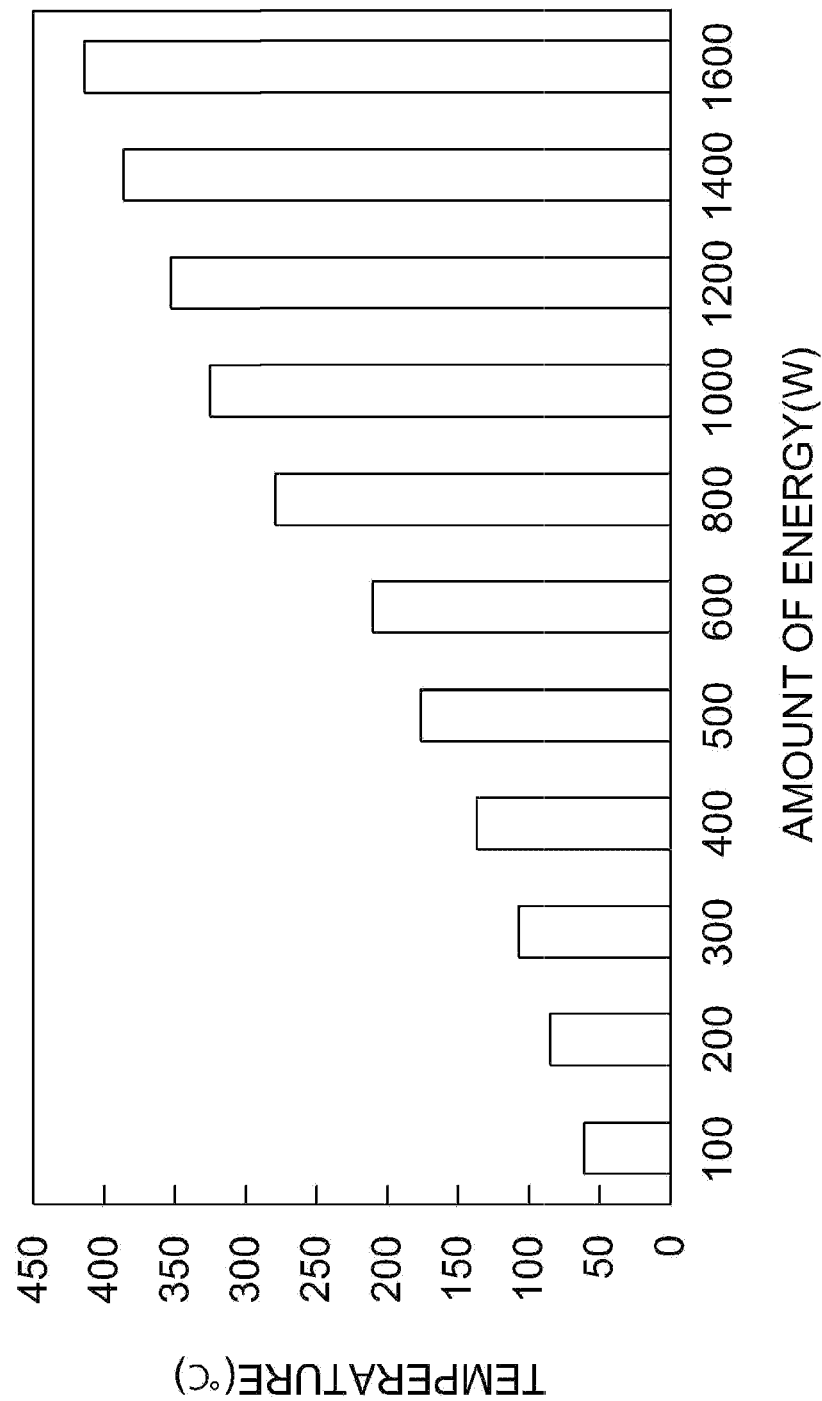
FIG. 2 is a graph illustrating correlation data between the amount of energy of electromagnetic waves and the temperature of a substrate.

As the amount (power W) of energy of the electromagnetic waves radiated to the wafer 11 increases, the wafer 11 is heated to a higher temperature. FIG. 2 illustrates an example of correlation data between the amount of energy of electromagnetic waves and the temperature of the wafer 11 when the electromagnetic waves were radiated to the wafer 11 formed of, for example, silicon. Referring to FIG. 2, the wafer 11 reached higher temperatures when greater amounts of energy of the electromagnetic waves were radiated to the wafer 11. For example, the temperature of the wafer 11 varies according to the size or shape of the process chamber 10, the position of the waveguide opening 22, the position of the wafer 11, etc. However, the correlation between the amount of energy of electromagnetic waves and the temperature of the wafer 11, i.e., that the temperature of the wafer 11 increases with greater amounts of energy of the electromagnetic waves, does not change.

The inventors have found that the amount or energy of electromagnetic waves radiated to the wafer 11 varies according to the position of the process chamber 10. Thus, the inventors have determined that the processing uniformity of the wafer 11 can be improved by installing an auxiliary electromagnetic wave supply unit at a portion of process chamber 10 where an amount of or energy of electromagnetic waves radiated to the wafer 11 in the process chamber 10 is low. The processing uniformity of the wafer 11 may be improved by installing the auxiliary electromagnetic wave supply unit to be spaced from the electromagnetic wave radiation unit 19 in the direction of the diameter of the wafer 11. As the auxiliary electromagnetic wave supply unit, a plurality of electromagnetic wave radiation units 19 may be additionally installed or a member that reflects or diffuses electromagnetic waves radiated by the electromagnetic wave radiation unit 19 may be installed in the process chamber 10 or on a support table 25.

Electromagnetic Wave Diffusion Unit

Referring to FIG. 1, an electromagnetic wave diffusion unit 208 serving as an auxiliary electromagnetic wave supply unit that reflects electromagnetic waves (which may also be referred to as penetrating electromagnetic waves), which are radiated to the wafer 11 mainly by the electromagnetic wave radiation unit 19 and penetrate the wafer 11 without being absorbed by the wafer 11, to be diffused to the wafer 11, is installed at the center of the bottom of the inside of the process chamber 10. The electromagnetic wave diffusion unit 208 is installed to face a back surface of the wafer 11 (a surface opposite to a processed surface of the wafer 11) supported by the substrate support mechanisms 13 which will be described below. That is, the electromagnetic wave diffusion unit 208 is installed to diffuse the penetrating electromagnetic waves toward the back surface of the wafer 11. In addition, the electromagnetic wave diffusion unit 208 is configured to be rotatable as will be described below.

The electromagnetic wave diffusion unit 208 may be formed of, for example, a conductive material (a metal material having a conductive property) such as aluminum (Al) or stainless steel (SUS). Thus, most electromagnetic waves (most penetrating electromagnetic waves) may be reflected from a surface of the electromagnetic wave diffusion unit 208.

The electromagnetic wave diffusion unit 208 is configured to diffuse electromagnetic waves to the wafer 11 by changing a direction in which penetrating electromagnetic waves propagate. The electromagnetic wave diffusion unit 208 is configured to reflect penetrating electromagnetic waves from the back surface of the wafer 11 and radiate the reflected electromagnetic waves toward a region of the wafer 11 other than a region of the wafer 11 facing the electromagnetic wave radiation unit 19. That is, the electromagnetic wave diffusion unit 208 is configured such that penetrating electromagnetic waves are not excessively radiated to a region of the wafer 11 to which electromagnetic waves generated by the electromagnetic wave radiation unit 19 are directly radiated.

For example, the electromagnetic wave diffusion unit 208 is formed such that at least a region of the electromagnetic wave diffusion unit 208 facing the electromagnetic wave radiation unit 19 is disposed to face the center of the electromagnetic wave radiation unit 19 when the electromagnetic wave diffusion unit 208 is rotated, thereby increasing the distance between the wafer 11 and the electromagnetic wave diffusion unit 208. Thus, electromagnetic waves may be radiated to the wafer 11 to be uniformly distributed within a plane of the wafer 11 by changing the direction in which the penetrating electromagnetic waves propagate. Thus, the surface of the wafer 11 may be uniformly heated. By forming the electromagnetic wave diffusion unit 208 as described above, the intensity of an electric field of penetrating electromagnetic waves radiated to the wafer 11 by the electromagnetic wave diffusion unit 208 may be controlled. That is, the intensity of an electric field of penetrating electromagnetic waves radiated by the electromagnetic wave diffusion unit 208 may be controlled to be lower with respect to a region of the wafer 11 to which more direct electromagnetic waves are radiated. Thus, heating within the plane of the wafer 11 may be more uniform. The direct electromagnetic waves are electromagnetic waves that are radiated directly to the wafer 11 by the electromagnetic wave radiation unit 19 without being reflected from an inner wall of the process container 18 or a surface of the wafer 11 among electromagnetic waves radiated to the wafer 11.

For example, the electromagnetic wave diffusion unit 208 includes a disk-shaped unit 208a serving as an auxiliary central supply unit, and a ring-shaped unit 208b serving as an auxiliary circumferential supply unit installed to surround the disk-shaped unit 208a. The disk-shaped unit 208a and the ring-shaped unit 208b are configured to form a gap having a predetermined width between the disk-shaped unit 208a and the ring-shaped unit 208b. That is, the disk-shaped unit 208a and the ring-shaped unit 208b are formed such that a gap is formed in a region of the electromagnetic wave diffusion unit 208 facing the electromagnetic wave radiation unit 19 when the electromagnetic wave diffusion unit 208 is rotated. In this case, the disk-shaped unit 208a and the ring-shaped unit 208b may be formed such that, for example, a minimum width of a gap is substantially the same as a width of the electromagnetic wave radiation unit 19. The disk-shaped unit 208a may have, for example, a truncated cone shape, and the ring-shaped unit 208b may be formed such that the distance between the wafer 11 and a surface of the ring-shaped unit 208b is longer when the center of the ring-shaped unit 208b is closer to the wafer 11. In detail, the disk-shaped unit 208a, which is the auxiliary central supply unit, may have a bottom surface (a surface opposite a top surface thereof) having a diameter of 3 mm to 150 mm (e.g., 105 mm) and a thickness of 1 mm to 30 mm (e.g., 19 mm) and a top surface (a surface facing the wafer 11) having a diameter of 3 mm to 100 mm (e.g., 73 mm). The ring-shaped unit 208b, which is the auxiliary circumferential supply unit, may have a top surface (a surface facing the wafer 11) having a width of 3 mm to 40 mm (e.g., 25 mm), a bottom surface (a surface opposite the top surface) having a width of 3 mm to 150 mm (e.g., 50 mm) and a thickness of 1 mm to 30 mm (e.g., 19 mm).

Although the case in which the disk-shaped unit 208a, which is the auxiliary central supply unit, has a truncated cone shape has been described above, the disk-shaped unit 208a is not limited to the truncated cone shape and may have, for example, a trapezoidal pyramid shape, a cylindrical shape, etc. The disk-shaped unit 208a may preferably have a three-dimensional (3D) shape having no angles. When the disk-shaped unit 208a is formed in a 3D shape having angles, an electric field is likely to be concentrated at the angles to cause a discharge (e.g., plasma, arc plasma, sparks, etc.) to occur. Thus, the disk-shaped unit 208a is preferably formed in a 3D shape having no chamfered angle. When the intensity of microwave power is sufficiently low, the disk-shaped unit 208a may be formed in a prism shape, a cone shape, a triangular prism shape, a triangular pyramid shape, etc.

The electromagnetic wave diffusion unit 208 is formed on the support table 25 formed of, for example, a metal material having a conductive property (a conductive material) such as aluminum (Al) or stainless steel (SUS). The support table 25 has a circular shape with a diameter greater than an outer diameter of the wafer 11 when viewed from a top surface thereof, and is formed in a disk shape or a cylindrical shape.

A rotation shaft 23 formed of, for example, a metal material such as stainless steel (SUS) is installed near a central portion of the support table 25 and opposite the process chamber 10. That is, the rotation shaft 23 is installed to support the support table 25 from below. A rotational elevating mechanism 24 is installed on the rotation shaft 23 to move the rotation shaft 23 upward/downward while rotating the rotation shaft 23. That is, the electromagnetic wave diffusion unit 208 is configured to be rotatable when the rotation shaft 23 is rotated through a rotating function of the rotational elevating mechanism 24 to rotate the support table 25. In addition, the electromagnetic wave diffusion unit 208 is configured to be moved upward/downward when the rotation shaft 23 is moved upward/downward through an elevating function of the rotational elevating mechanism 24 to move the support table 25 upward/downward.

The controller 80 which will be described below is electrically connected to the rotational elevating mechanism 24. The controller 80 is configured to control power supply to the rotational elevating mechanism 24 such that the support table 25 is rotated at a predetermined speed at predetermined timing and is moved to a predetermined height at predetermined timing.

Here, some electromagnetic waves radiated by the electromagnetic wave radiation unit 19 may be reflected from a surface of the wafer 11, an inner wall of the process container 18, etc. That is, not all electromagnetic waves radiated to the wafer 11 by the electromagnetic wave radiation unit 19 are absorbed by the wafer 11. In this case, the density of direct electromagnetic waves is higher than the sum of the density of electromagnetic waves radiated by the electromagnetic wave radiation unit 19 and reflected from, for example, a surface of the wafer 11 or an inner wall of the process container 18 (which may also be referred to as reflected electromagnetic waves) and the density of stationary waves that are a combination of the reflected electromagnetic waves and the direct electromagnetic waves, within a range of distance that is shorter than one wavelength of the electromagnetic waves radiated by the electromagnetic wave radiation unit 19. That is, since influences caused by the reflected electromagnetic waves and the stationary waves may be relatively reduced within the range of distance, more direct electromagnetic waves may be radiated to the wafer 11. In addition, the amount of energy of the direct electromagnetic waves is greater than the amount of energy of the reflected electromagnetic waves or the amount of energy of the stationary waves. When the amount of direct electromagnetic waves radiated to the wafer 11 is large, the energy of electromagnetic waves may be efficiently absorbed by the wafer 11.

Thus, the height of the support table 25 may be controlled through the elevating function of the rotational elevating mechanism 24 at least while electromagnetic waves are radiated by the electromagnetic wave radiation unit 19 so that the distance between the waveguide opening 22 and a surface (a processed surface) of the wafer 11 supported by the substrate support mechanisms 13 which will be described below may be shorter than one wavelength of electromagnetic waves radiated by the electromagnetic wave radiation unit 19. For example, when electromagnetic waves having a fixed frequency of 2.45 GHz are radiated by the electromagnetic wave radiation unit 19, the electromagnetic waves have a wavelength of about 122.4 mm. Thus, the height of support table 25 is adjusted so that the distance between the waveguide opening 22 and the surface of the wafer 11 may be shorter than 122.4 mm. In addition, for example, when electromagnetic waves having a fixed frequency of 5.8 GHz are radiated by the electromagnetic wave radiation unit 19, the electromagnetic waves have a wavelength of about 51.7 mm. Thus, the height of support table 25 is adjusted so that the distance between the waveguide opening 22 and the surface of the wafer 11 may be shorter than 51.7 mm. Accordingly, the amount of direct electromagnetic waves radiated to the wafer 11 is large and the efficiency of heating the wafer 11 may thus be improved. As a result, a duration for which the wafer 11 is heated may be decreased to reduce a thermal budget.

Reflected Electromagnetic Wave Radiation Unit

An inner wall auxiliary supply unit is installed on a sidewall of the process container 18 forming the process chamber 10 to auxiliarily supply electromagnetic waves from the sidewall of the process container 18. The inner wall auxiliary supply unit mainly includes a reflected electromagnetic wave radiation unit 213 that reflects reflected electromagnetic waves and radiates the reflected electromagnetic waves to the wafer 11. The reflected electromagnetic wave radiation unit 213 is installed to radiate the reflected electromagnetic waves toward a side surface of the wafer 11. The reflected electromagnetic wave radiation unit 213 may be installed at a position higher than a top surface of the electromagnetic wave diffusion unit 208 at a sidewall of the process container 18. That is, the reflected electromagnetic wave radiation unit 213 may be installed to face a side surface of the wafer 11 at least while electromagnetic waves are radiated by the electromagnetic wave radiation unit 19. The reflected electromagnetic wave radiation unit 213 is formed in a ring shape with an upper width of 1 mm to 20 mm (e.g., 11 mm), a lower width of 1 mm to 20 mm (e.g., 3 mm) and a thickness of 3 mm to 50 mm (e.g., 39 mm). The reflected electromagnetic wave radiation unit 213 is formed of, for example, a metal material having a conductive property (a conductive material) such as aluminum (Al) or stainless steel (SUS). Heating within a plane of the wafer 11 may be more uniform when the reflected electromagnetic wave radiation unit 213 is used.

Substrate Support Unit

The substrate support mechanisms 13 serving as substrate support units that support the wafer 11, e.g., substrate support pins, are installed on the support table 25. In the present embodiment, for example, three substrate support mechanisms 13 are installed. The substrate support mechanisms 13 are configured such that the wafer 11 is supported by top ends of the substrate support mechanisms 13. The substrate support mechanisms 13 are installed such that the center of the supported wafer 11 and the center of the process chamber 10 are roughly coincident with each other in a vertical direction. In addition, the substrate support mechanisms 13 are configured to support the wafer 11 to not be in contact with the electromagnetic wave diffusion unit 208 at least while electromagnetic waves are radiated by the electromagnetic wave radiation unit 19.

The substrate support mechanisms 13 are formed of, for example, a material having a low electro-thermal property such as quartz or Teflon (registered trademark). Here, the low electro-thermal property should be understood as being lower than the electro-thermal property of the electromagnetic wave diffusion unit 208 or the support table 25 described above. Thus, heat generated from the wafer 11 may be suppressed from leaking to the electromagnetic wave diffusion unit 208 or the support table 25 via the substrate support mechanisms 13.

The substrate support mechanisms 13 are installed on the support table 25. That is, the substrate support mechanisms 13 are configured to rotate the wafer 11 when the support table 25 is rotated by the above-described rotational elevating mechanism 24.

Also, the substrate support mechanisms 13 are installed to be moved upward/downward. That is, an elevating mechanism is installed on each of the substrate support mechanisms 13 to move the substrate support mechanism 13 upward/downward. The controller 80 which will be described below is electrically connected to the elevating mechanism. The controller 80 is configured to control power supply to the elevating mechanisms such that the substrate support mechanisms 13 are moved to a predetermined height at a predetermined timing.

The substrate support mechanisms 13 may support the wafer 11 at a position at which the distance between the back surface of the wafer 11 and a lowermost surface of the electromagnetic wave diffusion unit 208 is equal to a ¼ wavelength (i.e., λ/4) of electromagnetic waves radiated by the electromagnetic wave radiation unit 19 or an odd multiple of the ¼ wavelength (i.e., λ/4) of the electromagnetic waves at least while electromagnetic waves are radiated by the electromagnetic wave radiation unit 19. For example, when electromagnetic waves having a fixed frequency of 2.45 GHz are radiated by the electromagnetic wave radiation unit 19, the electromagnetic waves have a wavelength of 122.4 mm. Thus, the substrate support mechanisms 13 may be installed to support the wafer 11 such that the distance between the wafer 11 and the lowermost surface of the electromagnetic wave diffusion unit 208 is 30.6 mm. The lowermost surface of the electromagnetic wave diffusion unit 208 is a surface of the electromagnetic wave diffusion unit 208 opposite a surface of the electromagnetic wave diffusion unit 208 facing the wafer 11.

Thus, the wafer 11 is supported at a peak position of the electromagnetic waves (an anti-node of the electromagnetic waves). That is, the wafer 11 is supported at a position at which the intensity of an electric field of the electromagnetic waves is high. Thus, the efficiency of heating the wafer 11 may be improved more since the energy of the electromagnetic waves may be efficiently absorbed by the wafer 11. In addition, when penetrating electromagnetic waves are radiated to the wafer 11 by, for example, the electromagnetic wave diffusion unit 208, the penetrating electromagnetic waves may be suppressed from interfering with direct electromagnetic waves, thereby suppressing a decrease in the intensity of an electric field. That is, influence of stationary waves on the wafer 11 may be suppressed.

Also, the substrate support mechanism 13 may be configured to support the wafer 11 such that a side surface of the wafer 11 faces the reflected electromagnetic wave radiation unit 213 at least while electromagnetic waves are radiated to the wafer 11 by the electromagnetic wave radiation unit 19.

Gas Supply Unit

A gas supply unit 215 is installed on the process chamber 10 to supply an inert gas such as nitrogen (N2) gas into the process chamber 10. The gas supply unit 215 is air-tightly installed in an opening formed in an upper portion of the process container 18. The opening is connected to a downstream end of a gas supply pipe 216 that supplies the inert gas. The gas supply pipe 216 is formed of, for example, a non-metal material such as quartz or aluminum oxide, a metal material such as stainless steel (SUS), etc. A gas supply source 217, a mass flow controller (MFC) 218 which is a flow rate control device and a valve (opening/closing valve) 219 which is an opening/closing valve are sequentially connected to the gas supply pipe 216 from an upstream end. As the inert gas, a rare gas such as helium (He) gas or argon (Ar) gas may be used alone or in combination, in addition to the N2 gas.

The controller 80 which will be described below is electrically connected to the MFC 218 and the valve 219. The controller 80 is configured to control the degree of opening of the MFC 218 and opening/closing of the valve 219 so that a gas to be supplied into the process chamber 10 may have a predetermined flow rate at a predetermined timing.

The gas supply unit 215 according to the present embodiment mainly includes the gas supply pipe 216, the MFC 218 and the valve 219. The gas supply source 217 may be further included in the gas supply unit 215.

Exhaust Unit

An upstream end of an exhaust pipe 231 that exhausts an atmosphere in the process chamber 10 is connected to the process container 18. A pressure sensor 232 serving as a pressure detector (pressure detection unit) that detects a pressure in the process chamber 10, an auto pressure controller (APC) valve 233 serving as a pressure adjustment device and a vacuum pump 246 serving as a vacuum exhaust device are installed sequentially from the upstream end at the exhaust pipe 231.

The controller 80 which will be described below is electrically connected to the APC valve 233 and the pressure sensor 232. The controller 80 is configured to control the APC valve 233 to set a pressure in the process chamber 10 to be equal to a predetermined pressure at predetermined timing, based on a pressure value detected by the pressure sensor 232.

An exhaust unit according to the present embodiment mainly includes the exhaust pipe 231, the pressure sensor 232 and the APC valve 233. The vacuum pump 246 may be further included in the exhaust unit.

The APC valve 233 is a valve configured to vacuum-exhaust the inside of the process chamber 10 or suspend the vacuum-exhausting by opening/closing the APC valve 233 while the vacuum pump 246 is operated, and to adjust a pressure in the process chamber 10 by adjusting a degree of opening of the APC valve 233 while the vacuum pump 246 is operated. That is, the exhaust unit is configured to control an "actual pressure" in the process chamber 10 to approximate a predetermined "set pressure" by adjusting the degree of opening of the APC valve 233 based on pressure information detected by the pressure sensor 232 while operating the vacuum pump 246. For example, a set pressure in the process chamber 10 is changed and the degree of opening of the APC valve 233 is changed according to the set pressure so as to change the actual pressure in the process chamber 10 when there is no change in the flow rate of a gas such as an inert gas supplied into the process chamber 10 or when the supply of a gas into the process chamber 10 is stopped. As a result, an exhausting capability of the exhaust unit changes and thus the actual pressure in the process chamber 10 gradually approximates the set pressure (in a curved gradient). As described above, the "set pressure" in the process chamber 10 may be understood as having the same meaning as a "target pressure" when pressure control is performed on the inside of the process chamber 10. The "actual pressure" in the process chamber 10 is controlled to follow the target pressure. In addition, "changing the set pressure in the process chamber 10" actually has the same meaning as "changing the degree of opening of the APC valve 233 to change the exhausting capability of the exhaust unit" and may be considered as "a command instructing to change the degree of opening of the APC valve 233."

Control Unit

Figure 3:
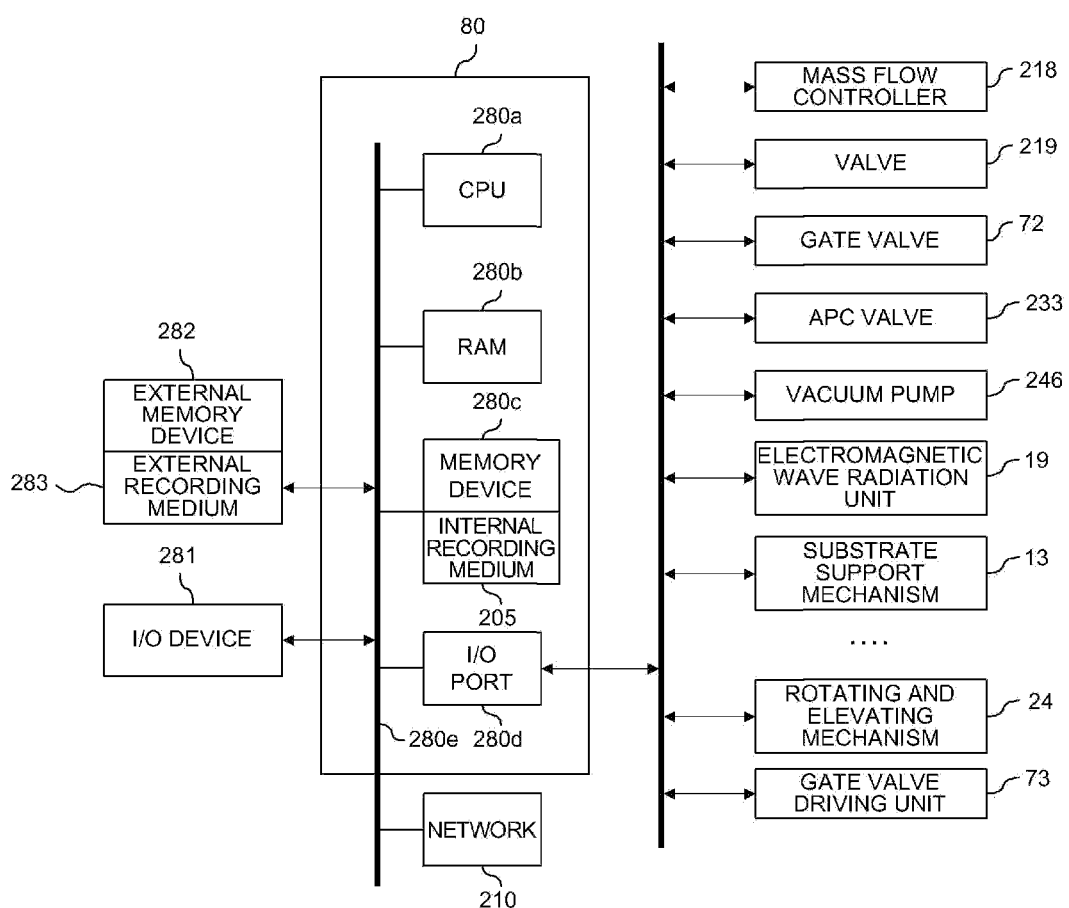
FIG. 3 is a schematic configuration diagram of a controller of the substrate processing apparatus according to the first embodiment of the present invention.

Referring to FIG. 3, the controller 80, which is a control unit (control means), is configured as a computer including a central processing unit (CPU) 280a, a random access memory (RAM) 280b, a memory device 280c and an input/output (I/O) port 280d. The RAM 280b, the memory device 280c and the I/O port 280d are configured to exchange data with the CPU 280a via an internal bus 280e. An I/O device 281, e.g., a touch panel, a mouse, a keyboard, a manipulation terminal or the like, may be connected to the controller 80. In addition, a display unit such as a display may be connected to the controller 80.

Also, the controller 80 is connected to a network 210. The network 210 may be embodied as a network installed in a semiconductor manufacturing factory, the Internet, or the like.

The memory device 280c is configured, for example, as a flash memory, a hard disk drive (HDD), a compact disc (CD)-read only memory (ROM) or the like. In the memory device 280c, a control program for controlling an operation of the substrate processing apparatus 100, a process recipe including an order or conditions of substrate processing, etc. is stored to be readable. The process recipe is a combination of sequences of a substrate processing process which will be described below to obtain a desired result when the sequences are performed by the controller 80, and acts as a program. Hereinafter, the process recipe, the control program, etc. will also be referred to together simply as a "program." In addition, when the term "program" is used in the present disclosure, it should be understood as including only the process recipe, only the control program, or both of the process recipe and the control program. The RAM 280b is configured as a memory area (work area) in which a program or data read by the CPU 280a is temporarily stored.

The I/O port 280d is connected to the MFC 218, the valve 219, the APC valve 233, the vacuum pump 246, the electromagnetic wave radiation unit 19, the substrate support mechanisms 13, the rotational elevating mechanism 24, etc.

The CPU 280a is configured to read and execute the control program from the memory device 280c and to read the process recipe from the memory device 280c according to a manipulation command received via the I/O device 281. In addition, the CPU 280a is configured to, based on the read process recipe, control radiating of electromagnetic waves by the electromagnetic wave radiation unit 19, control rotation of the wafer 11 by the rotational elevating mechanism 24, control adjusting of the height of the support table 25 by the rotational elevating mechanism 24, control adjusting of the heights of the substrate support mechanisms 13, control a flow rate of a gas by the MFC 218, control opening/closing of the valve 219, control the degree of opening of the APC valve 233, control driving/suspending of the vacuum pump 246, etc.

The controller 80 is not limited to a dedicated computer and may be configured as a general-purpose computer. For example, the controller 80 according to the present embodiment may be configured by providing an external memory device 282 storing a program as described above, e.g., a magnetic tape, a magnetic disk (e.g., a flexible disk, a hard disk, etc.), an optical disc (e.g., a compact disc (CD), a digital versatile disc (DVD), etc.), a magneto-optical (MO) disc or a semiconductor memory (e.g., a Universal Serial Bus (USB) memory, a memory card, etc.), and then installing the program in a general-purpose computer using the external memory device 282. However, a means for supplying the program to a computer is not limited to using the external memory device 282. For example, the program may be supplied to a computer using a communication means, e.g., the Internet or an exclusive line, without using the external memory device 282. The memory device 280c or the external memory device 282 may be configured as a non-transitory computer-readable recording medium. Hereinafter, the memory device 280c and the external memory device 282 may also be referred to together simply as a "recording medium." When the term "recording medium" is used in the present disclosure, it may be understood as only the memory device 280c, only the external memory device 282, or both of the memory device 280c and the external memory device 282.

Also, the program may be stored in the external memory device 282 installed outside the controller 80, read from the external memory device 282, and executed. Otherwise, the program recorded on the external memory device 282 may be moved to an internal recording medium 205, read from the internal recording medium 205, and executed. In addition, the program may be stored in the internal recording medium 205 via the network 210 connected to the controller 80 and then be executed.

(2) Substrate Processing Process

Figure 4:
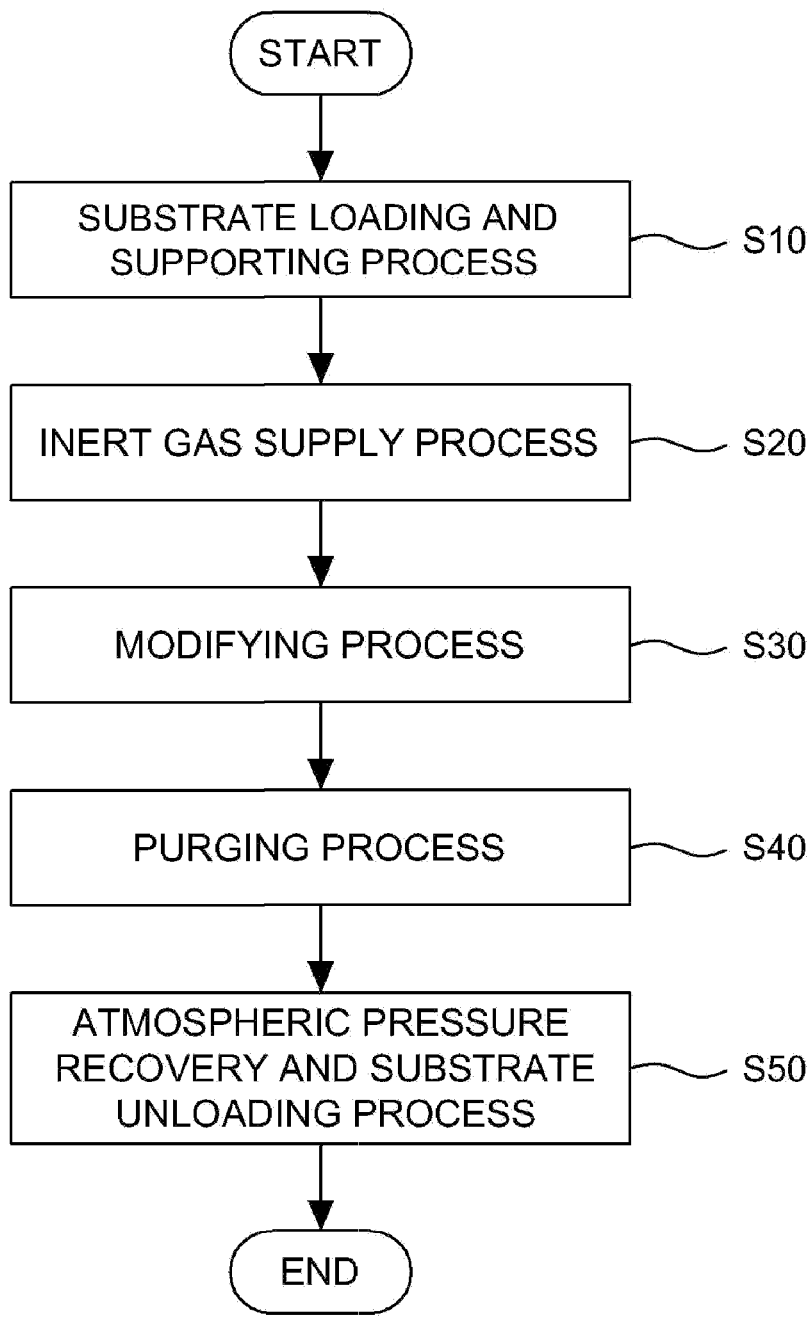
FIG. 4 is a flowchart illustrating a substrate processing process performed by the substrate processing apparatus according to the first embodiment of the present invention.

Next, a substrate processing process performed as a process of a semiconductor device manufacturing process will be described with reference to FIG. 4 below. The substrate processing process is performed by the substrate processing apparatus 100 described above. As an example, a process of modifying a high-k film in order to remove impurities such as carbon (C) or hydrogen (H) from a high-k film (a high-k gate insulating film), such as a HfO film, which is formed on the wafer 11 by chemical vapor deposition (CVD) will be described here. In the following description, operations of various components of the substrate processing apparatus 100 are controlled by the controller 80.

Substrate Loading & Supporting Process (Step S10)

First, the gate valve 72 is opened to communicate the process chamber 10 and a transfer chamber with each other. Then, the wafer 11 is loaded in the process chamber 10 (the process container 18) using a transfer robot. Then, the wafer 11 is placed on top ends of the substrate support mechanisms 13. Thus, the wafer 11 is supported on the substrate support mechanisms 13 in a horizontal posture.

When the wafer 11 is loaded in the process chamber 10, the transfer robot is withdrawn to the outside of the process chamber 10, the gate valve 72 is closed, and the inside of the process chamber 10 is air-tightly blocked. Then, the support table 25 is moved upward/downward to adjust the height of the support table 25. That is, the height of the support table 25 is adjusted such that the distance between the waveguide opening 22 and a surface (a processed surface) of the wafer 11 is shorter than a wavelength of electromagnetic waves radiated by the electromagnetic wave radiation unit 19. In addition, the substrate support mechanisms 13 are moved upward/downward to adjust the height thereof. That is, the heights of the substrate support mechanisms 13 are adjusted such that the distance between the wafer 11 and a lowermost surface of the electromagnetic wave diffusion unit 208 is equal to a ¼ wavelength (i.e., $\lambda/4$) of electromagnetic waves radiated by the electromagnetic wave radiation unit 19 or is an odd multiple of $\lambda/4$.

Inert Gas Supply Process (S20)

When the gate valve 72 is open while the wafer 11 is loaded in the process chamber 10, air may flow into the process chamber 10 from the outside of the process chamber 10. An atmosphere in the process chamber 10 is replaced with an inert gas atmosphere so that a modifying process (step S30) which will be described below may not be negatively influenced by moisture, oxygen, or the like contained in the air. That is, the valve 219 is opened to supply an inert gas, e.g., nitrogen (N2) gas, into the process chamber 10. A flow rate of the inert gas supplied into the process chamber 10 is adjusted by the MFC 218. The valve 219 is maintained open at least until processing of the wafer 11 (the modifying process (step S30) which will be described below) is completed.

Also, the inside of the process chamber 10 is vacuum-exhausted to a desired pressure (degree of vacuum) by the vacuum pump 246 while N2 gas is supplied into the process chamber 10. In this case, the pressure in the process chamber 10 is measured by the pressure sensor 232 and the APC valve 233 (the degree of opening of the APC valve 233) is feedback-controlled based on the measured pressure (pressure control). The desired pressure may be, for example, a pressure higher than a pressure that does not cause plasma to be generated in process chamber 10. For example, the desired pressure may be higher than 200 Torr. In addition, the vacuum pump 246 is continuously operated at least until processing of the wafer 11 (the modifying process (step S30) which will be described below) is completed.

Then, rotation of the support table 25, i.e., rotation of the wafer 11, is started. In this case, the speed of the rotation of the support table 25 is controlled by the controller 80. In addition, the wafer 11 is continuously rotated by rotating the support table 25 at least until processing of the wafer 11 is completed. The speed of the rotation may be 1 rpm to 30 rpm, and preferably 5 rpm to 20 rpm.

Modifying Process (Step S30)

When the inside of the process chamber 10 reaches the desired pressure (e.g., atmospheric pressure), the electromagnetic wave radiation unit 19 starts radiating electromagnetic waves such as microwaves to the wafer 11, and heating of the wafer 11 is started. That is, electromagnetic waves having a predetermined energy level (e.g., 1,600 W) and a predetermined fixed frequency (e.g., 2.54 GHz) are generated by the electromagnetic wave generator 20 and are radiated to the wafer 11. Thus, a high-k film formed on the wafer 11 is heated to, for example, 100° C. to 600° C. so that impurities may be separated from the high-k film to be removed from the high-k film. That is, the high-k film formed on the wafer 11 may be crystallized to be modified into a stable insulating thin film.

In this case, penetrating electromagnetic waves are radiated by the electromagnetic wave diffusion unit 208 to be diffused toward the wafer 11. That is, the penetrating electromagnetic waves are reflected by the electromagnetic wave diffusion unit 208 to be radiated toward a region of the wafer 11 other than a region of the wafer 11 facing the waveguide opening 22. In other words, the penetrating electromagnetic waves are radiated by the electromagnetic wave diffusion unit 208 to a region of the wafer 11 to which direct electromagnetic waves are not excessively radiated. In addition, reflected electromagnetic waves are reflected by the reflected electromagnetic wave radiation unit 213 to be radiated toward a side surface of the wafer 11. Thus, the electromagnetic waves may be uniformly radiated within a plane of the wafer 11. Accordingly, the heating within the plane of the wafer 11 may be uniform.

When a predetermined process time (e.g., five minutes) elapses, the radiation of the electromagnetic waves to the wafer 11 is stopped and the modifying process (step S30) ends.

Here, the heating of the wafer 11 by radiating electromagnetic waves to the wafer 11 and the modifying of the high-k film formed on the wafer 11 will be described. The heating of the wafer 11 by radiating electromagnetic waves to the wafer 11 is dielectric heating performed using the difference between property values (such as a dielectric constant $\in$ or a dielectric tangent tan δ) of dielectric materials. A property value such as the dielectric constant $\in$ or the dielectric tangent tan δ is a unique value of a material.

For example, the dielectric constant $\in$ of silicon that is a material of the wafer 11 is 9.6. In addition, the dielectric constant $\in$ of the high-k film (dielectric material), e.g., a HfO film, is 25, and the dielectric constant $\in$ of a ZrO film is 35. An absorption rate of electromagnetic waves into a dielectric material varies according to the property value of the dielectric material. That is, the absorption rate of electromagnetic waves into a material is higher and the material can be heated more easily when the dielectric constant $\in$ of the material is higher. Thus, when electromagnetic waves are simultaneously radiated to dielectric materials having different property values such as a dielectric constant $\in$, a dielectric material having a higher dielectric constant $\in$ may be selectively heated. That is, when electromagnetic waves are radiated to the wafer 11 on which the high-k film is formed, the high-k film may be selectively heated.

Also, the dielectric material (the high-k film) having a higher dielectric constant $\in$ may be heated more quickly when the amount of energy (power (W)) of the electromagnetic waves radiated to the wafer 11 is higher. Thus, a duration for which the electromagnetic waves are radiated may be decreased. Thus, the high-k film may be modified by heating the high-k film to a desired temperature before the temperature of the whole wafer 11 increases, and the radiation of the electromagnetic waves may end. That is, the radiation of the electromagnetic waves may end when the high-k film is selectively and rapidly heated before silicon that is a material of the wafer 11 is heated. Accordingly, the high-k film may be modified using a low thermal budget.

In contrast, a duration for which electromagnetic waves are radiated to modify a desired high-k film increases when electromagnetic waves with a relatively low power level are radiated to the wafer 11. When the duration for which electromagnetic waves are radiated increases, silicon that is a material of the wafer 11 may be dielectrically heated by the electromagnetic waves. In addition, heat generated from the high-k film may be conducted to the wafer 11. As a result, the temperature of the whole wafer 11 increases and the thermal budget may thus increase.

Although a case in which substrate processing is performed in a state in which the support table 25 is rotated has been described above, the present invention is not limited thereto. For example, substrate processing may be performed in a state in which the support table 25 is fixed or while the support table 25 is moved upward/downward. In addition, substrate processing may be performed using a combination of the rotation of the support table 25 and the upward/downward movement of the support table 25. The processing uniformity of the wafer 11 may be changed by changing the height of the support table 25 as will be described below. The processing uniformity of the wafer 11 may be improved by changing the height of the support table 25 by moving the support table 25 at least once (preferably, twice) during supply of microwaves. A distance within which the support table 25 is moved upward/downward is about 1 mm to 20 mm. For example, the support table 25 is moved 5 mm. The processing uniformity of the wafer 11 may be improved by moving the support table 25 to a height of 0 mm and a height of 5 mm during the supply of the microwaves. Here, the upward/downward movement of the support table 25 may be performed to change the height of the support table 25 by moving the support table 25 step by step or continuously.

Purging Process (Step S40)

After the modifying process (step S30) ends, impurities such as carbon (C) or hydrogen (H) separated from the high-k film are discharged from the inside of the process chamber 10. In this case, the discharging of the impurities from the process chamber 10 may be promoted by continuously exhausting the inside of the process chamber 10 via the exhaust pipe 231 while N2 gas is supplied as an inert gas into the process chamber 10 in a state in which the valve 219 is open.

Atmospheric Pressure Recovery and Substrate Unloading Process (Step S50)

After the purging process (step S40) ends, the degree of opening of the APC valve 233 is adjusted to return a pressure in the process chamber 10 to atmospheric pressure. Then, the wafer 11 is unloaded from the process chamber 10 using the transfer robot in an order reverse to the order in which the substrate loading process described above was performed, and the substrate processing process performed by the substrate processing apparatus according to the first embodiment of the present invention ends.

(3) Effects of the Present Embodiment

According to the present embodiment, one or more of the following effects can be achieved:

In the present embodiment, the electromagnetic wave radiation unit 19 that radiates electromagnetic waves to the wafer 11 is included in the substrate processing apparatus 100. In addition, the wafer 11 is heated by the electromagnetic wave radiation unit 19 radiating electromagnetic waves toward a surface of the wafer 11. That is, a material having a high dielectric constant ∈ is selectively heated by radiating the electromagnetic waves to the wafer 11. Thus, the temperature of the whole wafer 11 may be suppressed more than when the wafer 11 is heated by a heating mechanism such as a heater, thereby decreasing the thermal budget.

In the present embodiment, the electromagnetic wave diffusion unit 208 is installed in the process chamber 10 to reflect penetrating electromagnetic waves that are radiated by the electromagnetic wave radiation unit 19 and that penetrate the wafer 11 so that the penetrating electromagnetic waves diffuse toward a back surface of the wafer 11. That is, the electromagnetic wave diffusion unit 208 is configured to diffuse electromagnetic waves to the wafer 11 by changing a direction in which the penetrating electromagnetic waves propagate. In detail, the electromagnetic wave diffusion unit 208 is configured to radiate the penetrating electromagnetic waves toward a region of the wafer 11 other than a region of the wafer 11 facing the electromagnetic wave radiation unit 19. Thus, the electromagnetic waves may be radiated uniformly within a plane of the wafer 11. Accordingly, the in-plane of the wafer 11 may be uniformly heated.

In the present embodiment, the electromagnetic wave diffusion unit 208 is installed to face the back surface of the wafer 11 supported by the substrate support mechanisms 13. In general, electromagnetic waves that are radiated by the electromagnetic wave radiation unit 19 and reflected from a surface of the wafer 11 or an inner wall of the process chamber 10 a greater number of times have a lower amount of energy. Thus, the electromagnetic wave diffusion unit 208 is installed to radiate, to the wafer 11, penetrating electromagnetic waves whose energy level decreases to a small extent, such as penetrating electromagnetic waves radiated directly to the wafer 11 by the electromagnetic wave radiation unit 19 and penetrating the wafer 11 (penetrating electromagnetic waves among direct electromagnetic waves). Thus, the electromagnetic wave diffusion unit 208 may reflect electromagnetic waves whose energy level is relatively high toward the back surface of the wafer 11. Accordingly, the efficiency of heating the wafer 11 may increase and thus a duration for which electromagnetic waves are radiated by the electromagnetic wave radiation unit 19 may decrease, thereby decreasing the thermal budget.

In the present embodiment, the electromagnetic wave diffusion unit 208 is formed such that when the electromagnetic wave diffusion unit 208 is rotated, at least a region of the electromagnetic wave diffusion unit 208 facing the electromagnetic wave radiation unit 19 is disposed to face the center of the electromagnetic wave radiation unit 19, thereby increasing the distance between the wafer 11 and the electromagnetic wave diffusion unit 208. Thus, the intensity of an electric field of penetrating electromagnetic waves radiated to the wafer 11 may be controlled using the electromagnetic wave diffusion unit 208. Accordingly, heating within a plane of the wafer 11 may be more uniform.

In the present embodiment, the reflected electromagnetic wave radiation unit 213 that reflects reflected electromagnetic waves present in the process chamber 10 toward a side surface of the wafer 11 is installed at a sidewall of the process chamber 10 (the process container 18). Thus, electromagnetic waves may be radiated to edge regions of the wafer 11 to which the electromagnetic waves are not easily radiated by the electromagnetic wave radiation unit 19. Accordingly, heating within a plane of the wafer 11 may be more uniform.

In the present embodiment, the electromagnetic wave diffusion unit 208 and the reflected electromagnetic wave radiation unit 213 are each formed of a conductive material. Thus, most electromagnetic waves (e.g., penetrating electromagnetic waves, etc.) may be reflected from surfaces of the electromagnetic wave diffusion unit 208 and the reflected electromagnetic wave radiation unit 213. Thus, the amount of electromagnetic waves radiated to the wafer 11 by the electromagnetic wave diffusion unit 208 and the reflected electromagnetic wave radiation unit 213 is large. Accordingly, the efficiency of heating the wafer 11 may be enhanced more to greatly decrease the thermal budget.

In the present embodiment, the wafer 11 is supported such that the distance between a back surface of the wafer 11 and a lowermost surface of the electromagnetic wave diffusion unit 208 is an odd multiple of a ¼ wavelength of electromagnetic waves radiated by the electromagnetic wave radiation unit 19 at least while electromagnetic waves are radiated by the electromagnetic wave radiation unit 19. Thus, the wafer 11 is supported at a position at which the intensity of an electric field of the electromagnetic waves is high. Accordingly, the efficiency of heating the wafer 11 may be enhanced more to greatly decrease the thermal budget.

In the present embodiment, the electromagnetic wave radiation unit 19 is installed to be dislocated from a position facing the center of the wafer 11 in the process chamber 10. In addition, the support table 25 is rotated to rotate the wafer 11 at least while electromagnetic waves are radiated by the electromagnetic wave radiation unit 19. Thus, a region of the wafer facing the electromagnetic wave radiation unit 19 may be expanded. Accordingly, the electromagnetic waves may be radiated to be uniformly distributed within a plane of the wafer 11 by the electromagnetic wave radiation unit 19. As a result, heating within the plane of the wafer 11 may be more uniform.

In the present embodiment, the inside of the process chamber 10 is set to have a pressure that does not cause plasma to be generated at least while electromagnetic waves are radiated by the electromagnetic wave radiation unit 19. Thus, the electromagnetic waves may be suppressed from being reflected by plasma. That is, propagation of the electromagnetic waves, which are radiated by the electromagnetic wave radiation unit 19, toward a surface of the wafer 11 may be suppressed from being blocked.

Modifications of the First Embodiment of the Present Invention

Although the first embodiment has been described above in detail, the present invention is not limited to the first embodiment and may be embodied in many different forms without departing from the scope of the invention.

Figure 5:
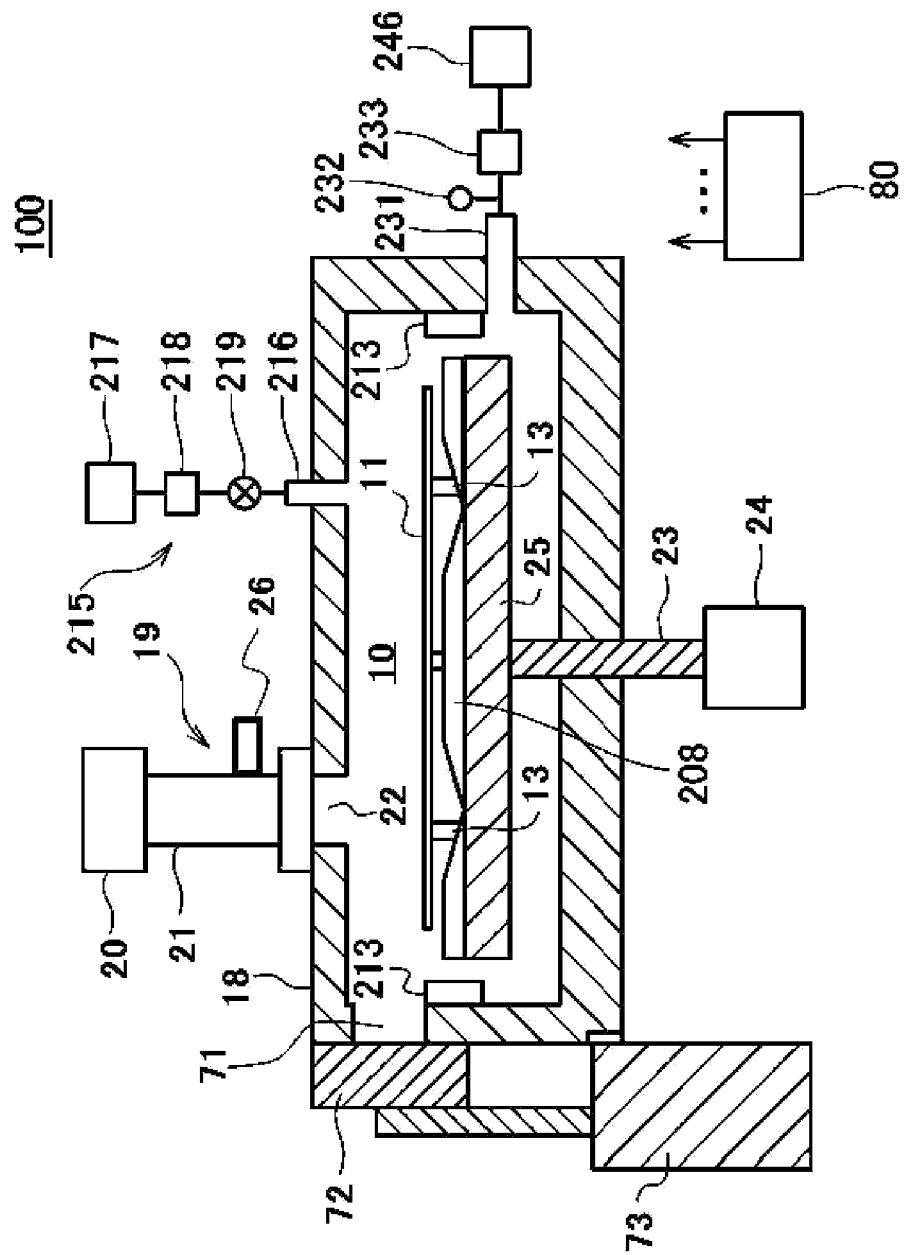
FIG. 5 is a vertical sectional view of a process chamber including an electromagnetic wave diffusion unit according to a first modification of the first embodiment of the present invention.
Figure 6:
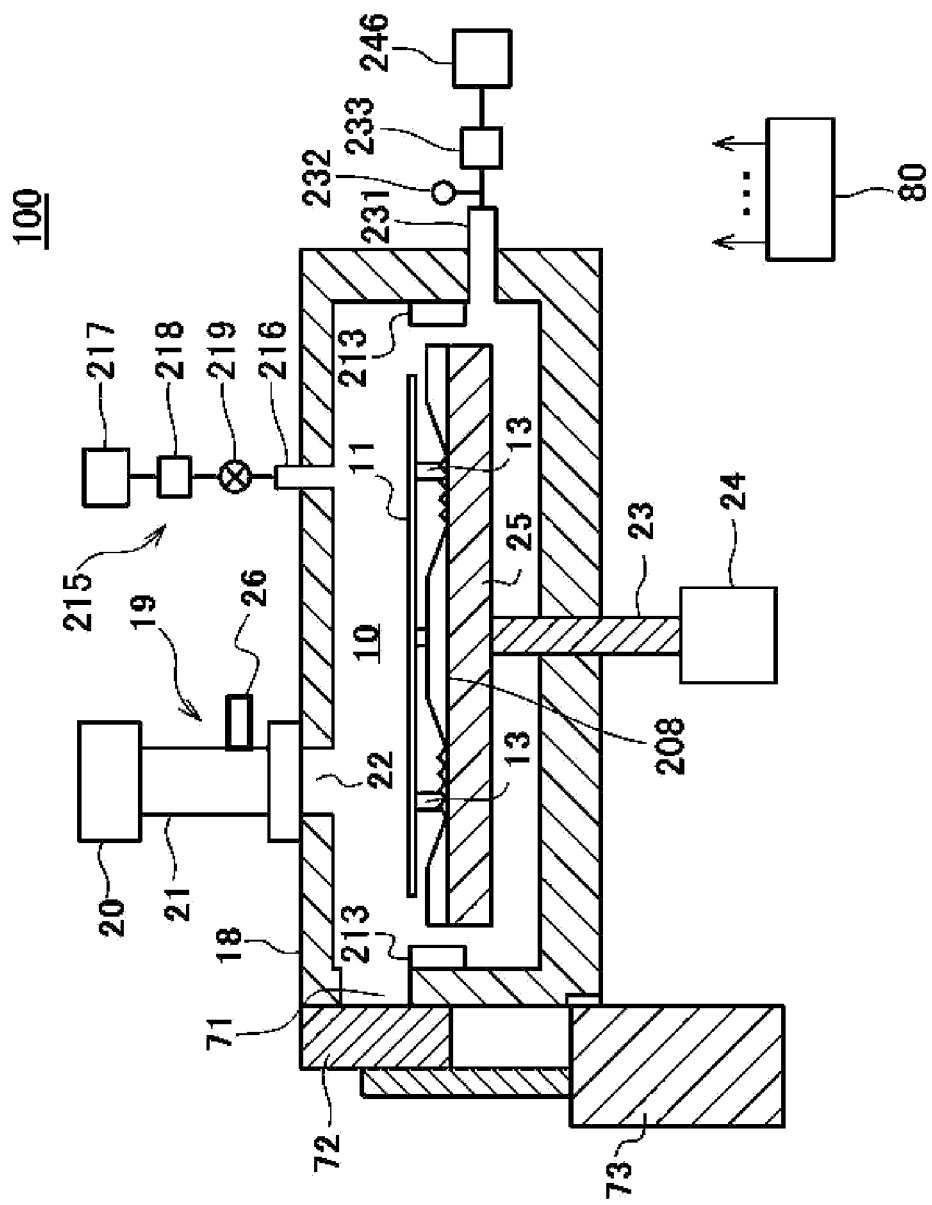
FIG. 6 is a vertical sectional view of a process chamber including an electromagnetic wave diffusion unit according to a second modification of the first embodiment of the present invention.

Although the electromagnetic wave diffusion unit 208 includes the disk-shaped unit 208a and the ring-shaped unit 208b in the first embodiment, the present invention is not limited thereto. For example, referring to FIG. 5, the electromagnetic wave diffusion unit 208 may be formed such that when at least a region thereof facing the electromagnetic wave radiation unit 19 is disposed facing the center of the electromagnetic wave radiation unit 19, the distance between the wafer 11 and the electromagnetic wave diffusion unit 208 increases. In addition, referring to FIG. 6, for example, a plurality of concavo-convex structures may be formed on a region of the electromagnetic wave diffusion unit 208 facing the electromagnetic wave radiation unit 19 to reflect penetrating electromagnetic waves to be diffused toward the wafer 11. Although FIG. 6 illustrates that cross-sections of the concavo-convex structures formed on the electromagnetic wave diffusion unit 208 are shaped in the form of a bellows which has triangular shapes, the present invention is not limited thereto. That is, the concavo-convex structures formed on the electromagnetic wave diffusion unit 208 may have various shapes, provided that they can reflect penetrating electromagnetic waves to be diffused to a region of the wafer 11 other than a region of the wafer 11 facing the electromagnetic wave radiation unit 19.

Although the electromagnetic wave generator 20 is configured to generate electromagnetic waves having a predetermined fixed frequency and radiate the electromagnetic waves to the wafer 11 in the first embodiment, the present invention is not limited thereto. For example, the electromagnetic wave generator 20 may be configured to generate electromagnetic waves with a frequency that changes (is variable) with time, and radiate the electromagnetic waves to the wafer 11. In addition, when electromagnetic waves having a variable frequency are generated by the electromagnetic wave generator 20, the distance between the back surface of the wafer 11 and the lowermost surface of the electromagnetic wave diffusion unit 208 may be calculated based on a wavelength of a representative frequency of a variable frequency band. For example, when the frequency of the electromagnetic waves ranges from 5.8 GHz to 7.0 GHz, the distance between the back surface of the wafer 11 and the lowermost surface of the electromagnetic wave diffusion unit 208 may be calculated by setting a representative frequency to a center frequency of a variable frequency band, i.e., 6.4 GHz. In this case, since a wavelength of the representative frequency of 6.4 GHz is 46 mm, the distance between the back surface of the wafer 11 and the lowermost surface of the electromagnetic wave diffusion unit 208 may be 11.5 mm.

Although the waveguide opening 22 is installed to be dislocated from a position facing the center of the wafer 11 in the first embodiment, the present invention is not limited thereto. For example, the waveguide opening 22 may be installed such that a center thereof faces the center of the wafer 11.

Although the height of the support table 25 is adjusted to adjust the distance between the waveguide opening 22 and a surface of the wafer 11 supported by the substrate support mechanisms 13 to be shorter than one wavelength of electromagnetic waves radiated by the electromagnetic wave radiation unit 19 in the first embodiments, the present invention is not limited thereto. That is, for example, the distance between the waveguide opening 22 and the surface of the wafer 11 supported by the substrate support mechanisms 13 may be adjusted by adjusting the height of the substrate support mechanism 13 or the heights of the support table 25 and the substrate support mechanisms 13.

Although the heights of the substrate support mechanism 13 and the support table 25 are adjusted beforehand in the first embodiments, the present invention is not limited thereto. That is, for example, the heights of the substrate support mechanism 13 and the support table 25 may be continuously adjusted at least while electromagnetic waves are radiated by the electromagnetic wave radiation unit 19 or may be adjusted appropriately according to a heated state of the wafer 11, etc. In addition, for example, the heights of the substrate support mechanism 13 and the support table 25 may be adjusted at predetermined timings (e.g., at predetermined time intervals) at least while electromagnetic waves are radiated by the electromagnetic wave radiation unit 19.

Although the substrate support mechanisms 13 supporting the wafer 11 are configured to support the wafer 11 at the same height in the first embodiments, the present invention is not limited thereto. That is, for example, the substrate support mechanisms 13 may be configured to support the wafer 11 at different heights. Thus, the inclination of the wafer 11 may be changed. Thus, a region to which penetrating electromagnetic waves are reflected to be radiated to the wafer 11 by the electromagnetic wave diffusion unit 208 may be controlled. As a result, heating within a plane of the wafer 11 may be more uniform. In addition, the heights of the respective substrate support mechanisms 13 may be continuously adjusted at least while electromagnetic waves are radiated by the electromagnetic wave radiation unit 19 or may be appropriately adjusted according to a heated state of the wafer 11, etc. In addition, the heights of the respective substrate support mechanisms 13 may be adjusted at predetermined timings (e.g., at predetermined time intervals).

Although the wafer 11 is rotated at a constant speed at least while electromagnetic waves are radiated by the electromagnetic wave radiation unit 19 in the first embodiment, the present invention is not limited thereto. For example, the speed of the rotation of the wafer 11 may be appropriately adjusted according to a heated state of the wafer 11. That is, the speed of the rotation of the wafer 11 may be decreased near a low-temperature region of the wafer 11 so that more electromagnetic waves may be radiated thereto.

Although the rotation of the wafer 11 and the heights of the substrate support mechanisms 13 and the support table 25 are adjusted in the first embodiment, the present invention is not limited thereto. That is, for example, at least one among the rotation of the wafer 11, the heights of the substrate support mechanisms 13, and the height of the support table 25 may be adjusted.

Although the electromagnetic wave diffusion unit 208 is installed on the support table 25 in the first embodiment, the present invention is not limited thereto. That is, for example, the electromagnetic wave diffusion unit 208 and the support table 25 may be integrally formed.

Although the rotational elevating mechanism 24 having a rotating function and an elevating function is installed on the rotation shaft 23 in the first embodiment, the present invention is not limited thereto. That is, for example, a rotational elevating mechanism and an elevating mechanism may be additionally installed on the rotation shaft 23.

Also, for example, the wafer 11 may be cooled when electromagnetic waves are radiated by the electromagnetic wave radiation unit 19. That is, for example, a cooling flow channel may be installed in the support table 25 to circulate a cooling medium such as a coolant. In addition, for example, the wafer 11 may be cooled by increasing the amount of an inert gas to be supplied into the process chamber 10 when electromagnetic waves are radiated by the electromagnetic wave radiation unit 19. Thus, the temperature of the whole wafer 11 may be suppressed from increasing.

Also, the present invention may be accomplished by, for example, changing a process recipe of an existing substrate processing apparatus. When the process recipe is changed, a process recipe according to the present invention may be installed in the existing substrate processing apparatus via a telecommunication line (a network or the Internet) or a recording medium storing the process recipe according to the present invention or the process recipe may be replaced with the process recipe according to the present invention by manipulating an input/output (I/O) device of the existing substrate processing apparatus.

EXAMPLES

Next, an example of the present invention will be described with reference to FIGS. 7 to 9 below. According to the present example, electromagnetic waves were radiated to the wafer 11 (on which a TiN film was formed and having a diameter of 300 mm) by the electromagnetic wave radiation unit 19 to heat the TiN film. In addition, the substrate processing apparatus 100 in which the electromagnetic wave radiation unit 19 was installed at a roughly central region of an upper wall of the process container 18 was prepared. That is, the substrate processing apparatus 100 in which the waveguide opening 22 was installed such that the center of the waveguide opening 22 faced the center of the wafer 11 was used.

Figure 7:
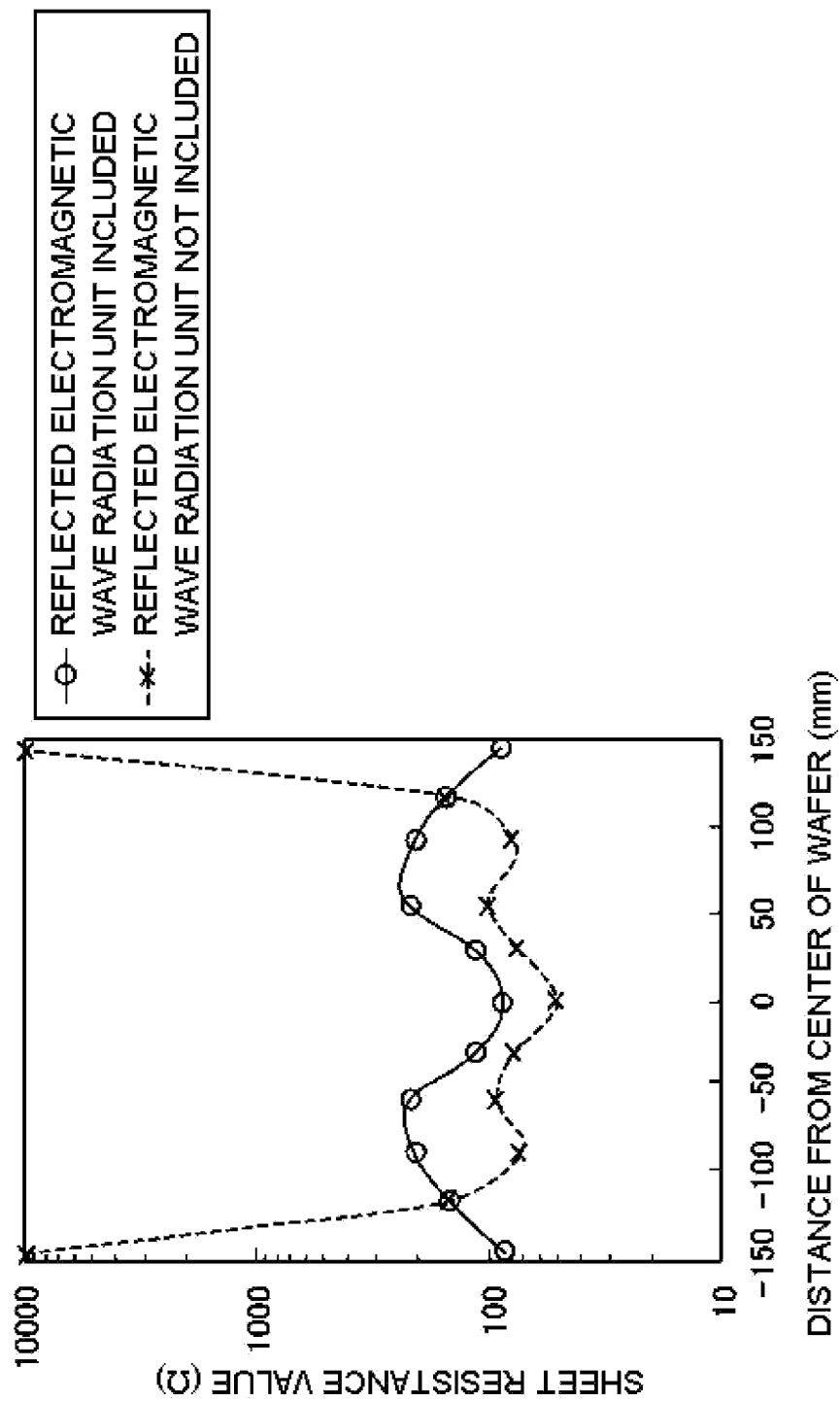
FIG. 7 is a graph illustrating a result of an evaluation of a sheet resistance value when a reflected electromagnetic wave radiation unit is installed according to the first embodiment of the present invention.

FIG. 7 is a graph illustrating a result of evaluating the intensity of electromagnetic waves radiated to a TiN film when the reflected electromagnetic wave radiation unit 213 was installed in the process chamber 10 according to the first embodiment of the present invention. The intensity of the electromagnetic waves was evaluated by measuring a sheet resistance value ($\Omega$) of the TiN film. That is, as the sheet resistance value ($\Omega$) increases, the intensity of the electromagnetic waves decreases, thereby making it difficult to generate heat. In FIG. 7, "reflected electromagnetic wave radiation unit included" should be understood to mean that the reflected electromagnetic wave radiation unit 213 was installed but the electromagnetic wave diffusion unit 208 was not installed, and "reflected electromagnetic wave radiation unit not included" should be understood to mean that neither the reflected electromagnetic wave radiation unit 213 nor the electromagnetic wave diffusion unit 208 was installed. Referring to FIG. 7, the sheet resistance value was lower at edge portions of the wafer 11 when the reflected electromagnetic wave radiation unit 213 was installed than when the reflected electromagnetic wave radiation unit 213 was not installed. That is, in particular, the edge portions of the wafer 11 were easier to heat when the reflected electromagnetic wave radiation unit 213 was installed.

Figure 8:
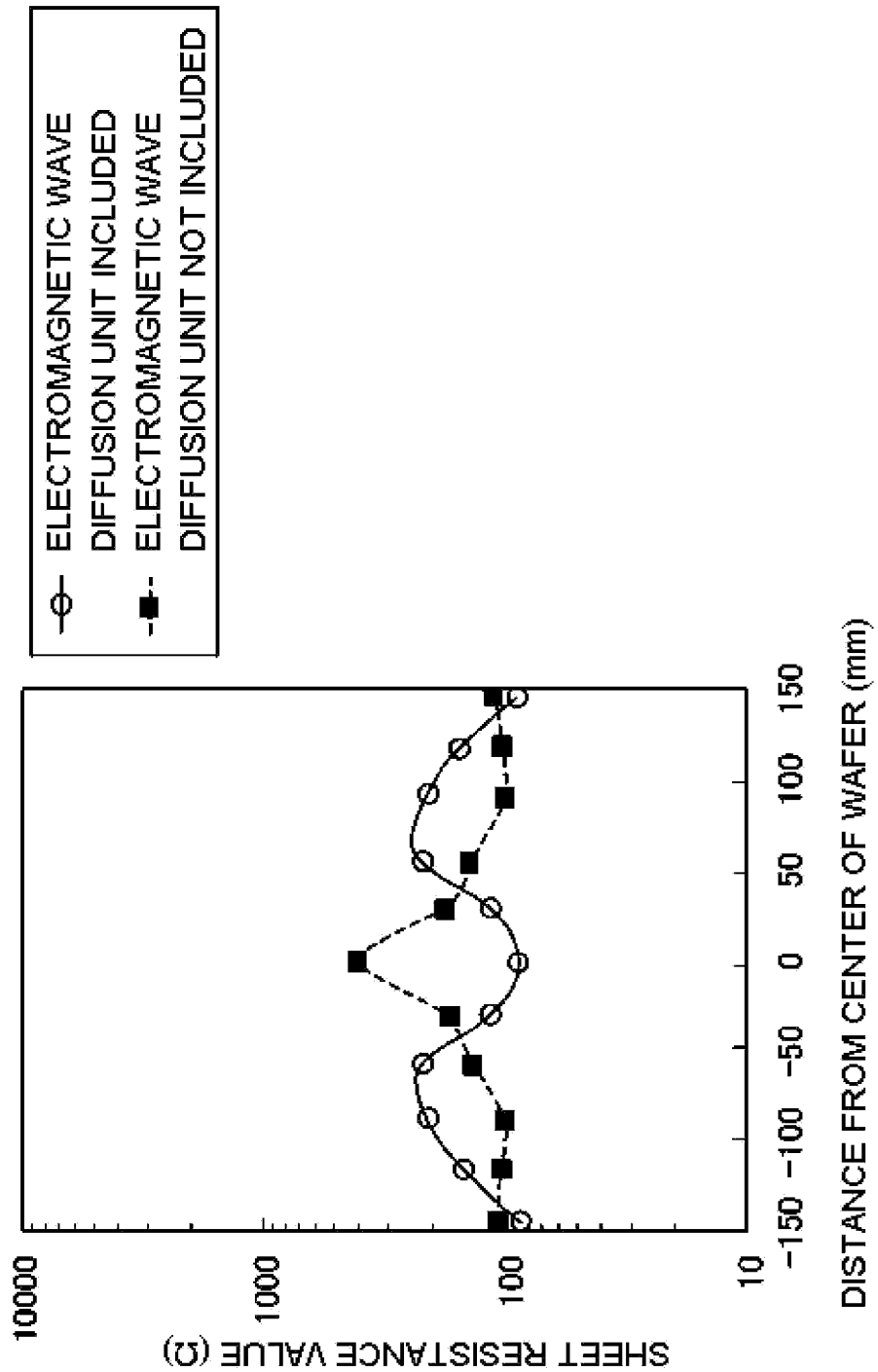
FIG. 8 is a graph illustrating a result of an evaluation of a sheet resistance value when an electromagnetic wave diffusion unit and a reflected electromagnetic wave radiation unit were installed according to the first embodiment of the present invention.

FIG. 8 is a graph illustrating a result of evaluating the intensity of electromagnetic waves radiated to a TiN film when the electromagnetic wave diffusion unit 208 was installed in the process chamber 10 according to the first embodiment of the present invention. The intensity of the electromagnetic waves was evaluated by measuring a sheet resistance value ($\Omega$) of the TiN film. In FIG. 8, "electromagnetic wave diffusion unit not included" should be understood to mean that the electromagnetic wave diffusion unit 208 was not installed but the reflected electromagnetic wave radiation unit 213 was installed, and "electromagnetic wave diffusion unit included" should be understood to mean that the electromagnetic wave diffusion unit 208 and the reflected electromagnetic wave radiation unit 213 were installed. Referring to FIG. 8, when both the reflected electromagnetic wave radiation unit 213 and the electromagnetic wave diffusion unit 208 were installed, the sheet resistance value was high at a central region of the wafer 11 (a region of the wafer 11 facing the electromagnetic wave radiation unit 19) while the sheet resistance value was suppressed from being low at edge regions of the wafer 11.

Figure 9:
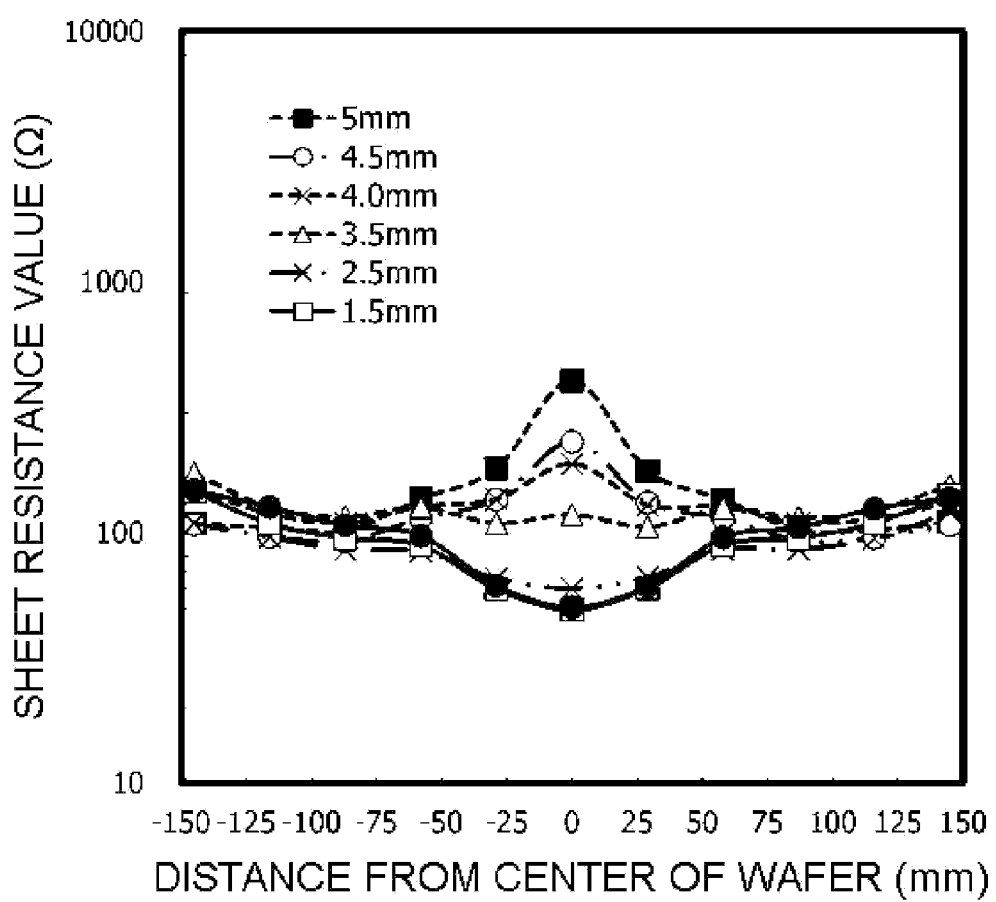
FIG. 9 is a graph illustrating the correlation between the distance between a back surface of a substrate and a lowermost surface of an electromagnetic wave diffusion unit and the intensity of an electric field according to the first embodiment of the present invention.

FIG. 9 is a graph illustrating the correlation between the distance between a lowermost surface of the reflected electromagnetic wave radiation unit 213 and a lowermost surface of the electromagnetic wave diffusion unit 208 in a direction of the heights thereof and the intensity of an electric field according to the first embodiment of the present invention. The intensity of the electric field was evaluated by measuring a sheet resistance value ($\Omega$) of a TiN film. The distances illustrated in FIG. 9 will be described below. The position of the electromagnetic wave diffusion unit 208 and the reflected electromagnetic wave radiation unit 213 were set as a reference of "0 mm" when the lowermost surface of the electromagnetic wave diffusion unit 208 and the lowermost surface of the reflected electromagnetic wave radiation unit 213 were leveled horizontally in a state in which the distance between the back surface of the wafer 11 and the lowermost surface of the electromagnetic wave diffusion unit 208 was set to be an odd multiple of a ¼ wavelength of electromagnetic waves radiated by the electromagnetic wave radiation unit 19. "1.5 mm" denotes that the electromagnetic wave diffusion unit 208 (the support table 25) was moved 1.5 mm from the position of 0 mm. "2.5 mm" denotes that that the electromagnetic wave diffusion unit 208 (the support table 25) was moved 2.5 mm from the position of 0 mm. "3.5 mm" denotes that that the electromagnetic wave diffusion unit 208 (the support table 25) was moved 3.5 mm from the position of 0 mm. "4.0 mm" denotes that that the electromagnetic wave diffusion unit 208 (the support table 25) was moved 4.0 mm from the position of 0 mm. "4.5 mm" denotes that that the electromagnetic wave diffusion unit 208 (the support table 25) was moved 4.5 mm from the position of 0 mm. "5.0 mm" denotes that that the electromagnetic wave diffusion unit 208 (the support table 25) was moved 5.0 mm from the position of 0 mm. It was noted from FIG. 9 that as the lowermost surface of the electromagnetic wave diffusion unit 208 moved away from the position of 0 mm in a positive (+) direction, the intensity of the electric field became higher. That is, when the electromagnetic wave diffusion unit 208 was moved 5 mm upward from the position of 0 mm, in particular, the sheet resistance value of the central portion of the wafer 11 increased. In addition, the sheet resistance value did not substantially change, i.e., the intensity of the electric field did not substantially change, when the electromagnetic wave diffusion unit 208 was moved 1.5 mm upward from the position of 0 mm, compared to when the electromagnetic wave diffusion unit 208 was disposed at the position 0 mm. In addition, it was found that standing waves among electromagnetic waves present in the process chamber 10 may be changed by adjusting the height of the support table 25 and that the uniformity of substrate processing may be improved by changing the height of the support table 25 during substrate processing.

Second Embodiment

The inventors of the present application conducted further research and found that a substrate processing apparatus capable of improving the in-plane uniformity of a substrate, a substrate supporting device and a substrate processing method can be provided by installing a groove between a top surface of a substrate mounting unit and a sealing unit. In this case, the inventors also found that microwaves may be suppressed from leaking and particles may be suppressed from being generated from a sealing member.

The structure of a substrate processing apparatus according to a second embodiment of the present invention will be described with reference to FIGS. 10 to 14, 15A and 15B below.

Figure 10:
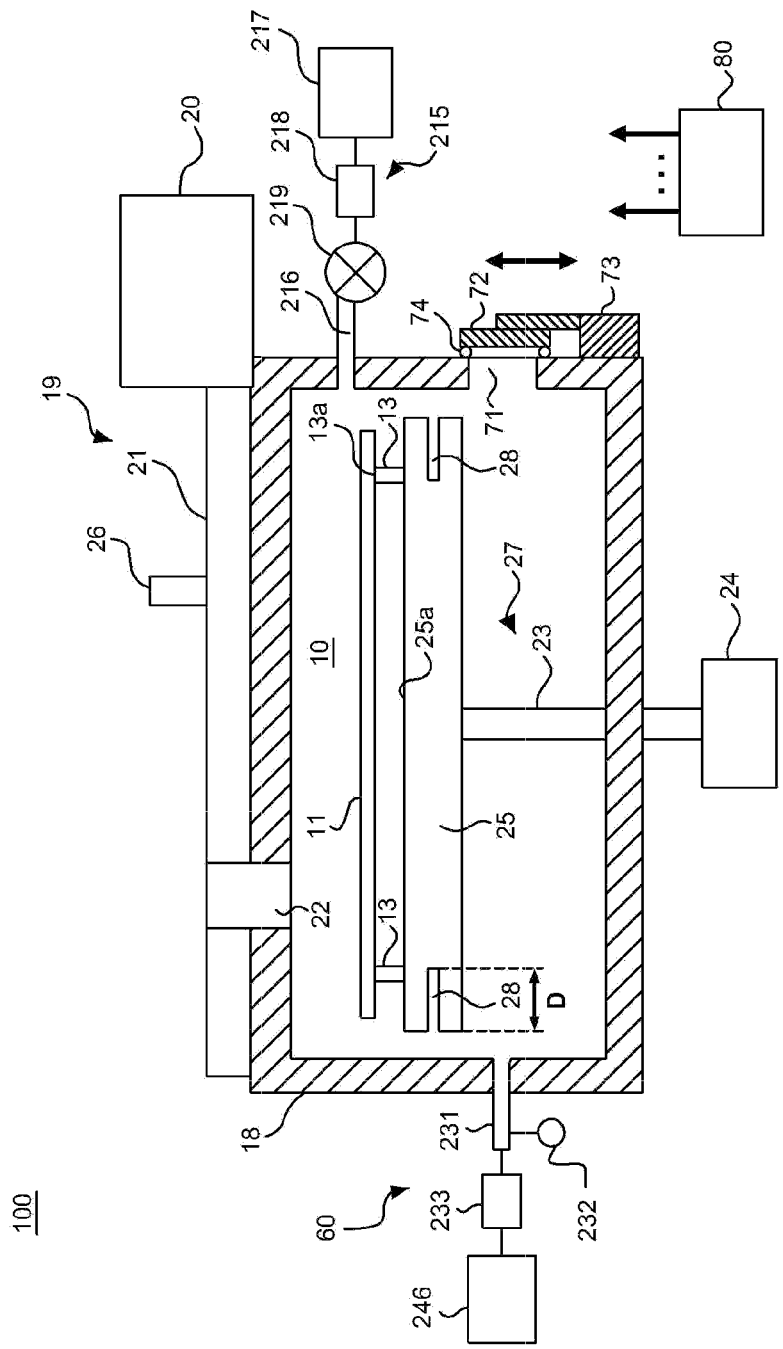
FIG. 10 is a vertical sectional view of a substrate processing apparatus according to a second embodiment of the present invention.

FIG. 10 is a vertical sectional view of a substrate processing apparatus 100 according to a second embodiment of the present invention. The substrate processing apparatus 100 includes a process chamber 10, a transfer chamber (not shown) and a microwave supply unit 19 serving as an electromagnetic wave supply unit. The process chamber 10 is configured to process a wafer 11 as a semiconductor substrate. The microwave supply unit 19 includes a microwave generator 20 serving as an electromagnetic wave generator, a waveguide 21 and a waveguide opening 22.

The microwave generator 20 generates, for example, fixed-frequency microwaves or variable-frequency microwaves. For example, a microtron, a klystron, a gyrotron, etc. is used as the microwave generator 20. Microwaves generated by the microwave generator 20 are radiated into the process chamber 10 through the waveguide opening 22 that communicates with the inside of the process chamber 10 via the waveguide 21. Thus, the efficiency of dielectric heating may be improved. In the waveguide 21, a matching mechanism 26 that lessens the amount of power reflected in the waveguide 21 is installed.

A process container 18 that forms the process chamber 10 is formed of, for example, a metal material such as aluminum (Al) or stainless steel (SUS), and has a structure that shields the process chamber 10 from microwaves.

Microwaves supplied into the process chamber 10 are repeatedly reflected from wall surfaces of the process container 18. The microwaves are reflected in the process chamber 10 in various directions and thus the inside of the process chamber 10 is filled with the microwaves. The microwaves radiated to the wafer 11 in the process chamber 10 are absorbed by the wafer 11, and the wafer 11 is dielectrically heated by the microwaves.

The microwave generator 20, the waveguide 21, the waveguide opening 22 and the matching mechanism 26 form the microwave supply unit 19.

A gas supply pipe 216 that supplies a gas, e.g., nitrogen (N2), is installed on a sidewall of the process container 18. A gas supply source 217, a flow rate control device 218 that controls the flow rate of a gas and an opening/closing valve 219 that opens/closes a gas flow channel are sequentially installed at the gas supply pipe 216 from the upstream end. A gas is supplied into the process chamber 10 via the gas supply pipe 216 or the supply of the gas is stopped by opening/closing the opening/closing valve 219. The gas supplied via the gas supply pipe 216 is used to cool the wafer 11 or is used as a purge gas to push out a gas or an atmosphere in the process chamber 10.

The gas supply pipe 216, the flow rate control device 218 and the opening/closing valve 219 form a gas supply unit 215. The flow rate control device 218 and the opening/closing valve 219 are electrically connected to a controller 80, and controlled by the controller 80. The gas supply source 217 may be installed at the gas supply unit 215.

A gas discharge pipe 231 that exhausts a gas from the inside of the process chamber 10 is installed at a sidewall of the process container 18. A vacuum pump 246 serving as an exhaust device and a pressure adjustment valve 233 are installed at the gas discharge pipe 231 sequentially from the upstream end. A pressure in the process chamber is adjusted to a predetermined value by adjusting the degree of opening of the pressure control valve 233.

The gas discharge pipe 231 and the pressure control valve 233 constitute a gas discharge unit. The pressure control valve 233 and the vacuum pump 246 are electrically connected to the controller 80, and controlled by the controller 80 to perform pressure adjustment. In addition, the vacuum pump 246 may be installed on the gas discharge unit.

A wafer loading port 71 is installed at a side surface of the process container 18 to transfer the wafer 11 into or out of the process chamber 10. A gate valve 72 serving as a shutter is installed at the wafer loading port 71 with a sealing part 74 (serving as a sealing unit, e.g., an O-ring) therebetween. A gate valve driving unit 73 is connected to the gate valve 72. The gate valve driving unit 73 is electrically connected to the controller 80, and the gate valve 72 is opened/closed by the controller 80. The inside of the process chamber 10 and the inside of the transfer chamber communicate with each other through opening/closing of the gate valve 72. The wafer loading port 71, the gate valve 72 and the gate valve driving unit 73 form a wafer transfer unit. A transfer robot (not shown) is installed in the transfer chamber to transfer the wafer 11. The transfer robot includes a transfer arm configured to support the wafer 11 when the wafer 11 is transferred. When the gate valve 72 is opened, the wafer 11 is transferred between the inside of the process chamber 10 and the inside of the transfer chamber through the transfer robot. When the gate valve 72 is closed, the inside of the process chamber 10 is air-tightly blocked.

A substrate mounting unit 25 configured to have the wafer 11 placed thereon is installed in the process chamber 10. The substrate mounting unit 25 includes substrate support pins 13 serving as substrate support mechanisms that support the wafer 11 on top ends 13a thereof.

The substrate support pins 13 are formed of, for example, a material having a low electro-thermal property and a high electrically insulating property, such as quartz, a ceramic, sapphire, or Teflon (registered trademark), etc. By forming the substrate support pins 13 of such a material, the substrate support pins 13 may be suppressed from being heated and heat may be suppressed from leaking from the wafer 11 to the substrate support pins 13. Since heat may be suppressed from leaking from the wafer 11 to the substrate support pins 13, the surface of the wafer 11 may be uniformly heated. In addition, the substrate support pins 13 are prevented from being deformed by preventing heating thereof, thereby controlling the heights of wafers to be the same. Accordingly, wafers in each slot may be heated reproducibly. In addition, a plurality of the substrate support pins 13 (three substrate support pins 13 in the present embodiment) is used.

In the present embodiment, the waveguide opening 22 is formed in an upper wall of the process container 18, and the distance between the waveguide opening 22 and a surface of the wafer 11 supported by the substrate support pins 13 is set to be shorter than one wavelength of supplied microwaves. In the present embodiment, a frequency of microwaves used in the present embodiment is set to 5.8 GHz and the distance between the waveguide opening 22 and a surface of the wafer 11 is set to be shorter than 51.7 mm, which is a wavelength of the microwaves. Direct waves radiated via the waveguide opening 22 are considered to be dominant within a range of distance shorter than one wavelength from the waveguide opening 22. By setting settings as described above, direct waves radiated directly via the waveguide opening 22 are dominant among microwaves radiated to the wafer 11 and an effect caused by standing waves present in the process container 18 may be controlled to be relatively low, thereby rapidly heating the wafer 11 near the waveguide opening 22.

Here, in general, temperature of the wafer 11 decreases when the power of microwaves is low and increases when the power of microwaves is high. In addition, the temperature of the wafer 11 varies according to the size or shape of the process container 18, the position of the waveguide opening 22 of the microwaves, and the position of the wafer 11. However, the correlation between the power of microwaves and the wafer 11 (i.e., that the temperature of the wafer 11 increases when the power of microwaves is high) does not change.

The substrate mounting unit 25 is formed of, for example, a metal material, which is a conductive material, such as aluminum (Al).

Since the substrate mounting unit 25 is formed of a metal material, the electric potential of the microwaves on a surface of the substrate mounting unit 25 is zero. For example, when the wafer 11 is directly placed on the substrate mounting unit 25, the intensity of the microwaves is weak and the wafer 11 is thus not heated. Thus, in the present embodiment, the wafer 11 is placed at a position spaced about a ¼ wavelength ($\lambda/4$) of the microwaves or an odd multiple of $\lambda/4$ from a surface of the substrate mounting unit 25. Here, the surface of the substrate mounting unit 25 means a surface of the substrate mounting unit 25 facing the back surface of the wafer 11. At the position spaced the odd multiple of $\lambda/4$, the intensity of an electric field is high and the wafer 11 may thus be efficiently heated with microwaves. In the present embodiment, since microwaves having, for example, a fixed frequency of 5.8 GHz are used and a wavelength of the microwaves is 51.7 mm, a height from the surface of the substrate mounting unit 25 to the wafer 11 is 12.9 mm.

A frequency of microwaves that changes (is variable) with time may be used. In this case, the height from the surface of the substrate mounting unit 25 to the wafer 11 may be calculated from a wavelength of a representative frequency of a variable frequency band. For example, when the frequency of the microwaves changes in a range of 5.8 GHz to 7.0 GHz, a center frequency of a variable frequency band may be set to be a representative frequency. Since a wavelength of the representative frequency of 6.4 GHz is 46 mm, the height from the surface of the substrate mounting unit 25 to the wafer 11 may be set to 11.5 mm.

Also, a plurality of fixed-frequency power sources may be installed, and microwaves having different frequencies may be alternately supplied from the plurality of respective fixed-frequency power sources.

A choke groove 28 serving as a groove structure is formed in entire side surfaces of the substrate mounting unit 25. When microwaves are supplied in a state in which the choke groove 28 is present between a top surface 25a of the substrate mounting unit 25 and the sealing part 74 (the wafer loading port 71), the microwaves may be prevented from leaking below the substrate mounting unit 25 and thus a conductive sealing member need not be used. In addition, microwaves may be confined in a space above the substrate mounting unit 25 to improve the processing efficiency of the wafer 11. In addition, the processing uniformity of the wafer 11 may be improved. In addition, the sealing part 74 may be prevented from burning out.

A depth D of the choke groove 28 is set to be, for example, less than or equal to a ¼ wavelength ($\lambda/4$) of microwaves. Thus, microwave cancellation is maximized at the choke groove 28, thereby greatly increasing the effect of preventing the microwaves from leaking.

The choke groove 28 may be filled with a dielectric material. Thus, particles may be prevented from flowing into and accumulating in the choke groove 28 while the size of the apparatus is minimized. As the dielectric material to be filled into the choke groove 28, for example, a material having a high dielectric constant, such as $SiO_2$ (silicon dioxide), $Al_2O_3$ (aluminum oxide), SiN (silicon nitride), AlN (aluminum nitride), etc., may be used.

The substrate mounting unit 25 is connected to a rotational elevating mechanism 24 while a bottom surface thereof is supported by a rotation shaft 23. The rotational elevating mechanism 24 is electrically connected to the controller 80, and the substrate mounting unit 25 is moved in a vertical direction while being rotated about the rotation shaft 23 by the controller 80. Microwaves may be uniformly radiated to a surface of the wafer 11 while the wafer 11 is rotated in a horizontal direction by rotating the substrate mounting unit 25. In addition, the substrate mounting unit 25 is moved upward in a direction perpendicular to a substrate transfer position at which the wafer 11 is loaded from the transfer chamber into the process chamber 10, the choke groove 28 is disposed above the sealing part 74 (the wafer loading port 71), and microwaves are radiated when the choke groove 28 is positioned between the top surface 25a of the substrate mounting unit 25 and the sealing part 74, Here, the substrate mounting unit 25, the substrate support pins 13, the rotation shaft 23 and the rotational elevating mechanism 24 form the substrate support unit 27.

The vicinity of the waveguide opening 22 is rapidly heated by microwaves because the intensity of an electric field at the vicinity of the waveguide opening 22 is high. However, a region spaced from the vicinity of the waveguide opening 22 is difficult to heat because the intensity of an electric field at the region is weak. Thus, the position of the waveguide opening 22 is set such that the center of the waveguide opening 22 and the center of the wafer 11 are dislocated from each other by 90 mm. As a result, the portion with high intensity electric field is dislocated from the center of the wafer 11. Accordingly, a film formed on the entire wafer 11 may be uniformly heated by rotating the wafer 11 to pass through the vicinity of the waveguide opening 22.

Figure 15A:
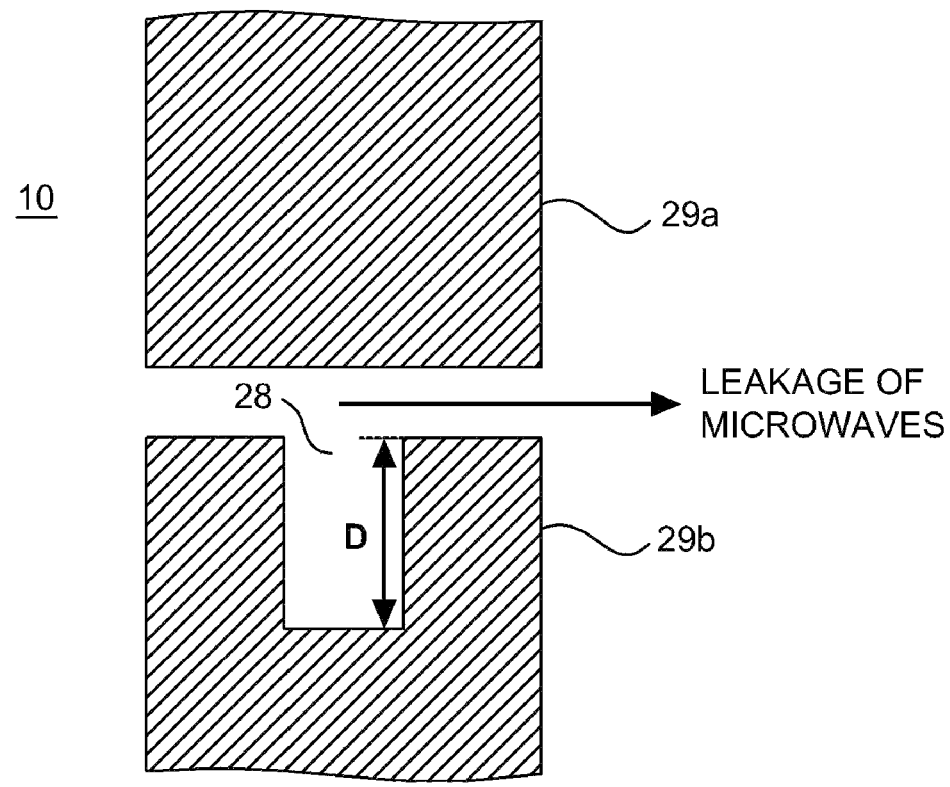
FIGS. 15A and 15B are diagrams illustrating a structure of choke according to the second embodiment of the present invention.
Figure 15B:
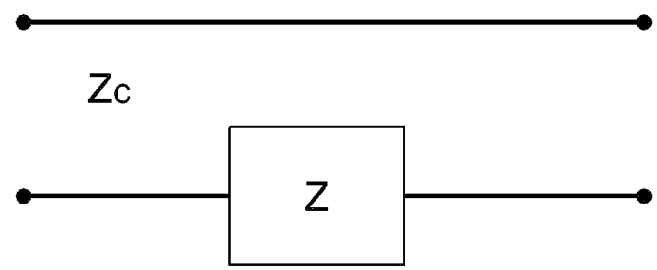

Next, a structure of choke will be described. FIGS. 15A and 15B are diagrams illustrating a structure of choke used in the present embodiment of the present invention. FIG. 15A illustrates a structure of choke in which a groove having a depth D (the choke groove 28) is formed in one of parallel flat plates 29a and 29b having a very narrow gap therebetween. In this case, the structure of choke may be illustrated as an equivalent circuit of FIG. 15B, and impedance Z of the groove having the depth D may be expressed as $Z=jZc \tan(2\pi D/\lambda)$. Here, 'Zc' denotes characteristic impedance. Thus, when $D=\lambda/4$, the impedance Z is maximized and an open end of the groove having the depth D is open to reflect leaky waves, thereby suppressing microwaves from propagating toward a downstream end.

If a relative dielectric constant of the dielectric material is ∈r, a dielectric constant of vacuum is ∈o and a magnetic permeability is µo, then the speed v of propagating microwaves in the dielectric material filled in the choke groove 28 may be expressed as Equation 1 below.

$$v = 1/\sqrt{\epsilon_r \epsilon_o \mu_o} \quad \text{[Equation 1]}$$

Thus, the speed v of propagating microwaves in the dielectric material is lower than that in the vacuum by a degree expressed in Equation 2 below, and a wavelength of the microwaves in the dielectric material is also shorter than that in the vacuum by the degree expressed in Equation 2 below.

$$1/\sqrt{\epsilon_r} \quad \text{[Equation 2]}$$

That is, when the choke groove 28 is filled with the dielectric material, not only may the depth D of the choke groove 28 be set to be shallow and small but particles may also be prevented from flowing and being accumulated into the choke groove 28.

The substrate processing apparatus 100 is controlled by a control unit similar to the controller 80 illustrated in FIG. 3.

Figure 11:
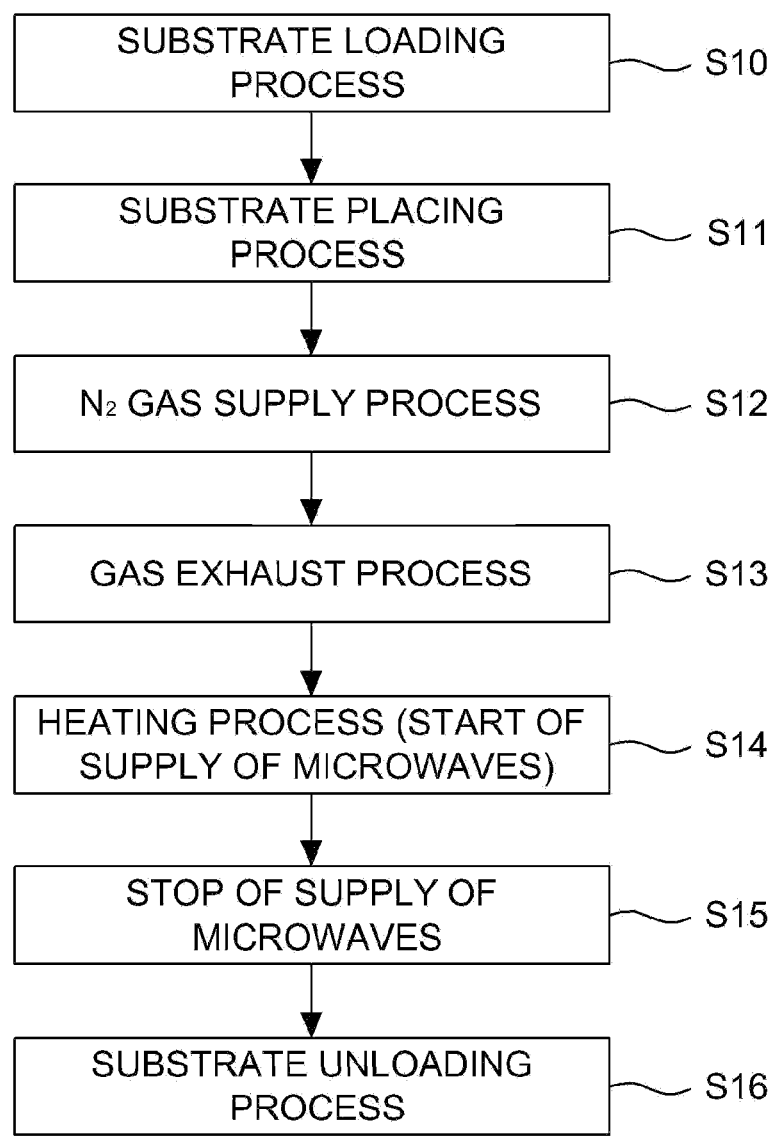
FIG. 11 is a flowchart illustrating a substrate processing process performed by the substrate processing apparatus according to the second embodiment of the present invention.

Next, substrate processing performed by the substrate processing apparatus 100 will be described. FIG. 11 is a flowchart illustrating a substrate processing process performed by the substrate processing apparatus according to the second embodiment of the present invention. The substrate processing according to the present embodiment is one of a plurality of processes performed to manufacture a semiconductor device. The operations of various components which will be described below are controlled by the controller 80.

Substrate Loading Process (Step S10)

In a substrate loading process of loading the wafer 11 into the process chamber 10, first, the gate valve 72 is opened to communicate the process chamber 10 and the transfer chamber with each other. Then, the wafer 11 to be processed (a substrate to be processed) is loaded into the process chamber 10 from the inside of the transfer chamber via the wafer loading port 71 by a transfer robot.

Substrate Placing Process (Step S11)

The wafer 11 loaded in the process chamber 10 is placed on the top ends 13a of the substrate support pins 13 by the transfer robot, and supported by the substrate support pins 13. Then, when the transfer robot returns to the inside of the transfer chamber from the inside of the process chamber 10, the gate valve 72 is closed.

Nitrogen Gas Supply Process (Step S12)

Next, an atmosphere in the process chamber 10 is replaced with a nitrogen (N2) atmosphere. When the wafer 11 is loaded in the process chamber 10, an air atmosphere outside the process chamber 10 flows into the process chamber 10. Thus, the atmosphere in the process chamber 10 is replaced with the nitrogen (N2) atmosphere so that the process may not be influenced by moisture or oxygen in the air atmosphere.

Gas Exhaust Process (Step S13)

The opening/closing valve 219 is opened to supply N2 gas into the process chamber 10 via the gas supply pipe 216, and at the same time, a gas (atmosphere) present in the process chamber 10 is discharged through the vacuum pump 246 via the gas discharge pipe 231 while a pressure in the process chamber 10 is adjusted to a predetermined value by controlling the pressure control valve 233.

Heating Process (Start of Supply of Microwaves), (Step S14)

Next, the substrate mounting unit 25 is moved upward such that the choke groove 28 is positioned between the top surface 25a of the substrate mounting unit 25 and the sealing part 74 (the wafer loading port 71). Then, the wafer 11 is rotated, and microwaves generated by the microwave generator 20 are supplied into the process chamber 10 via the waveguide opening 22 to radiate the microwaves to a surface of the wafer 11.

The microwaves generated by the microwave generator 20 are introduced into the process container 18 via the waveguide opening 22 to be radiated to the surface of the wafer 11. In the present embodiment, the microwaves are radiated to heat a high-k film formed on the wafer 11 to 100° C. to 600° C. so as to modify the high-k film, i.e., so that impurities such as carbon (C) or hydrogen (H) may be separated from the high-k film to modify the high-k film into a dense and stable insulating thin film.

Experimentally, the effect of modifying a film is high when high-power microwaves are radiated to the film. When the high-power microwaves are radiated, the temperature of the high-k film may be rapidly increased.

In contrast, when relatively low-power microwaves are radiated for a long time, a temperature of an entire substrate increases during a modifying process. When a predetermined time elapses, silicon is dielectrically heated by the microwaves, and the temperature of the silicon also increases as heat is conducted to silicon of a back surface of the substrate from a high-k film formed on the substrate to which the microwaves are radiated. The effect of modifying a film when high-power microwaves are radiated thereto is considered to be high because a dielectric material may be dielectrically heated to a high temperature within a time required to increase the temperature of the whole substrate to an upper temperature.

Thus, in the present embodiment, high-energy direct waves are radiated to the surface of the wafer 11 on which the high-k film is formed so as to greatly increase the difference between temperatures of the heated dielectric material and the heated wafer 11.

Also, the temperature of the wafer 11 may be suppressed from increasing by cooling the wafer 11 while the microwaves are radiated to the wafer 11. To cool the wafer 11, for example, the flow rate of an inert gas (e.g., N2 gas) introduced into the process container 18 may be increased and the temperature of the wafer 11 may also be controlled by controlling the flow rate of the inert gas.

Also, when the effect of cooling the wafer 11 using the N2 gas is actively used, a gas supply pipe may be installed at the substrate mounting unit 25 and the N2 gas may be supplied between the wafer 11 and the substrate mounting unit 25 to improve the effect of cooling the wafer 11 using the N2 gas. The temperature of the wafer 11 may be controlled by controlling the flow rate of the N2 gas.

Although the N2 gas is used in the present embodiment, another gas having a high heat transfer rate, e.g., diluted helium (He) gas, may be added to the N2 gas so as to improve the effect of cooling the wafer 11, provided that the adding of the other gas does not cause any process and safety problems.

Also, a coolant flow rate system, an opening/closing valve and a coolant flow channel (such as a coolant path) for circulating a refrigerant may be installed in the substrate mounting unit 25.

After the microwaves are supplied for a predetermined time to heat a substrate as described above, the supply of the microwaves is stopped (step S15).

Substrate Unloading Process (Step S16)

When the heating process ends, the heated wafer 11 is unloaded from the process chamber 10 into the transfer chamber in an order reverse to the order in which the substrate loading process described above was performed.

First Modification of Second Embodiment

Figure 12:
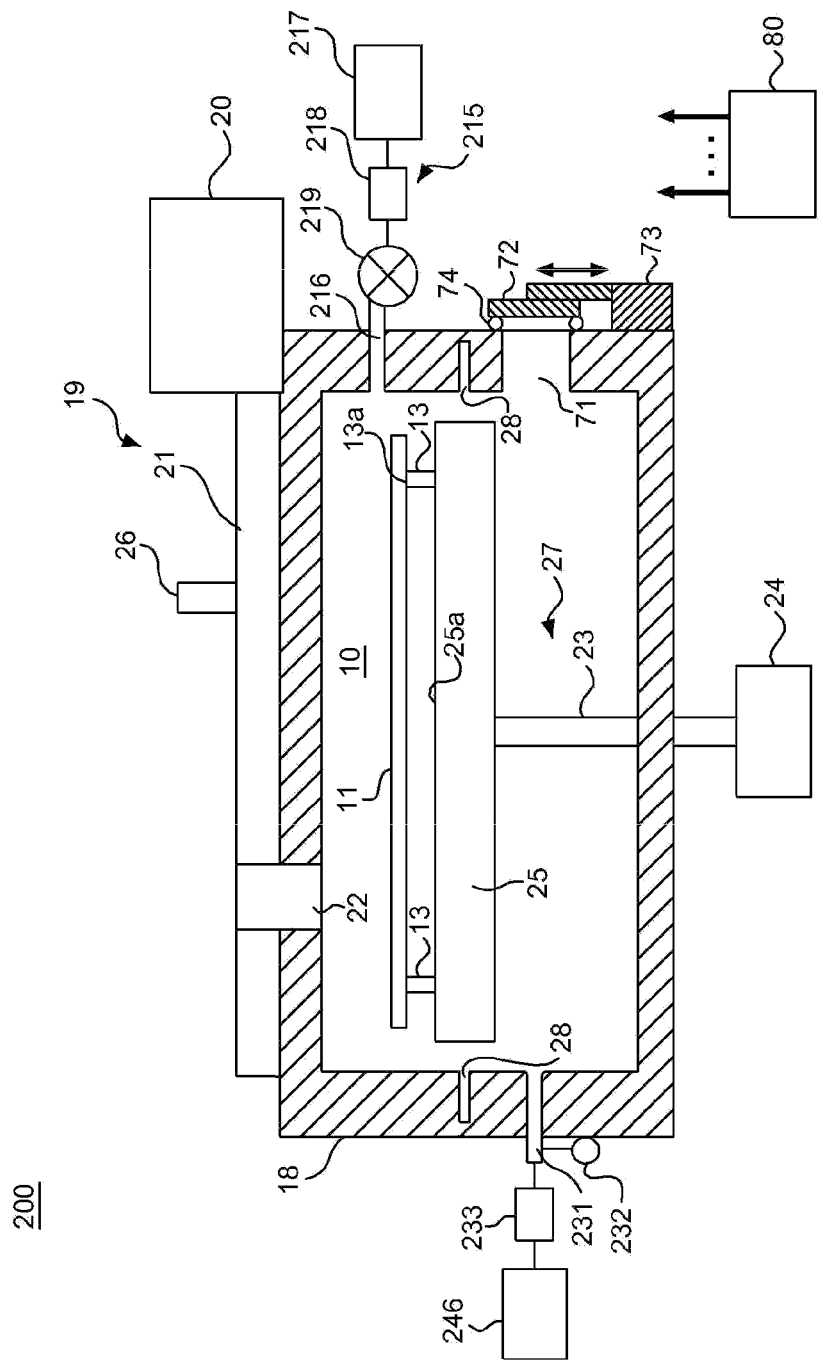
FIG. 12 is a vertical sectional view of a substrate processing apparatus according to a first modification of the second embodiment of the present invention.

Next, a substrate processing apparatus 200 according to a first modification of the second embodiment will be described below. FIG. 12 is a vertical sectional view of the substrate processing apparatus 200. The substrate processing apparatus 200 according to the first modification of the second embodiment has substantially the same structure as the substrate processing apparatus 100 according to the second embodiment, except for the positions of choke groove 28 serving as a groove structure.

In the substrate processing apparatus 200 according to the first modification, the choke groove 28 is formed in an inner wall of a process container 18 above a sealing part 74 (a wafer loading port 71), rather than in a substrate mounting unit 25. In a heating process, a controller 80 controls a rotational elevating mechanism 24 to move the substrate mounting unit 25 such that the choke groove 28 is disposed below a top surface 25a of the substrate mounting unit 25 to face a side surface of the substrate mounting unit 25. Thus, microwaves may be prevented from leaking below the substrate mounting unit 25 and thus a conductive sealing member need not be used. In addition, the microwaves may be confined in a space above the substrate mounting unit 25, thereby increasing the efficiency of processing the wafer 11. In addition, the sealing unit 74 may be prevented from burning out.

Second Modification of Second Embodiment

Figure 13:
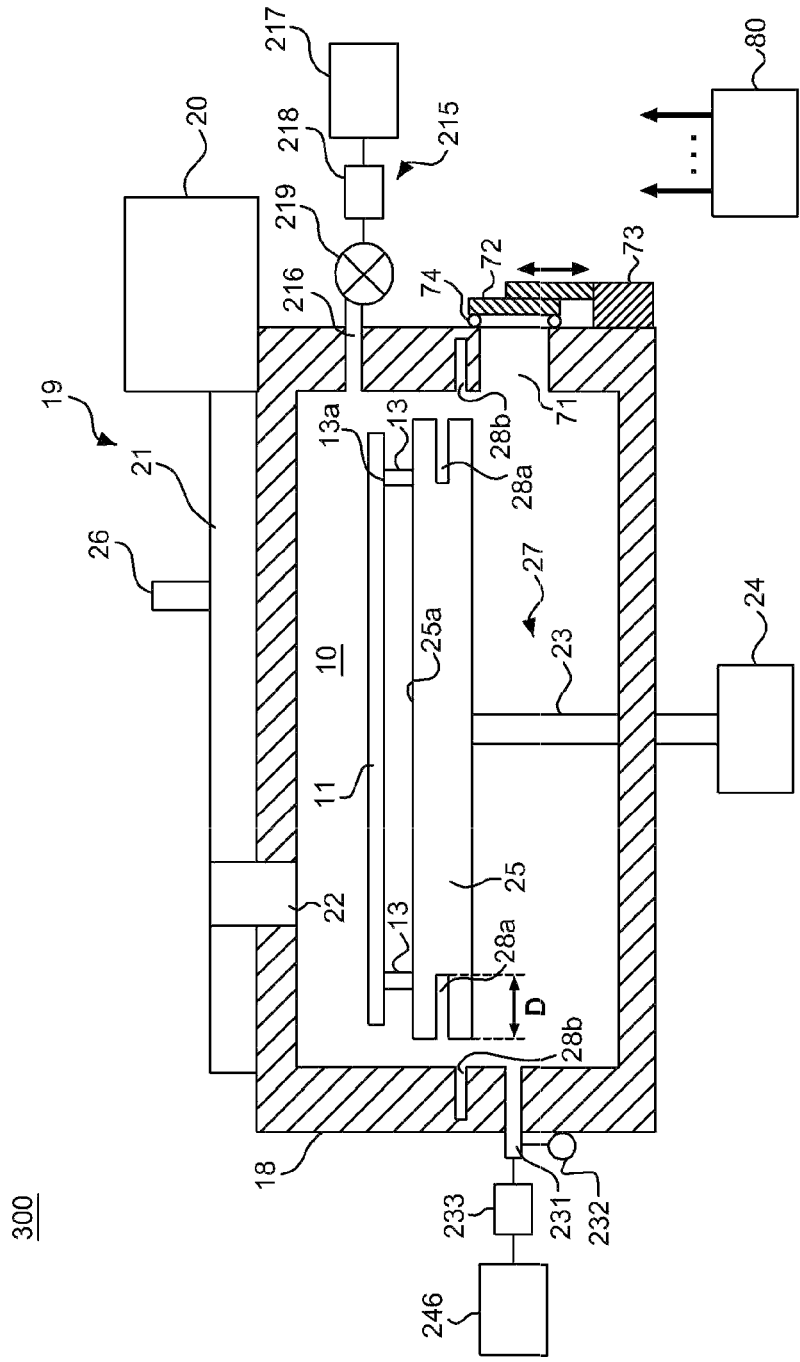
FIG. 13 is a vertical sectional view of a substrate processing apparatus according to a second modification of the second embodiment of the present invention.

Next, a substrate processing apparatus 300 according to a second modification of the second embodiment will be described below. FIG. 13 is a vertical sectional view of the substrate processing apparatus 300 according to the second modification of the second embodiment. The substrate processing apparatus 300 according to the second modification of the second embodiment has substantially the same structure as the substrate processing apparatus 100 according to the first embodiment and the substrate processing apparatus 200 according to the first modification of the second embodiment, except that two choke grooves serving as a groove structure, i.e., a first choke groove 28a and a second choke groove 28b, are formed.

In the substrate processing apparatus 300 according to the second modification of the second embodiment, the first choke groove 28a is formed in a side surface of a substrate mounting unit 25 and the second choke groove 28b is formed in an inner wall of a process container 18 above a sealing part 74 (a wafer loading port 71). In a heating process, a controller 80 controls a rotational elevating mechanism to move the substrate mounting unit 25 such that the second choke groove 28b is disposed at a position below a top surface 25a of the substrate mounting unit 25 and facing a sidewall of the substrate mounting unit 25 to not face the first choke groove 28a. Thus, microwaves may be prevented from leaking below the substrate mounting unit 25 and may be confined in a space above the substrate mounting unit 25, thereby increasing the efficiency of processing the wafer 11. In addition, the sealing part 74 may be prevented from burning out.

Third Modification of Second Embodiment

Next, a substrate processing apparatus 400 according to a third modification of the second embodiment will be described below.

Figure 14:
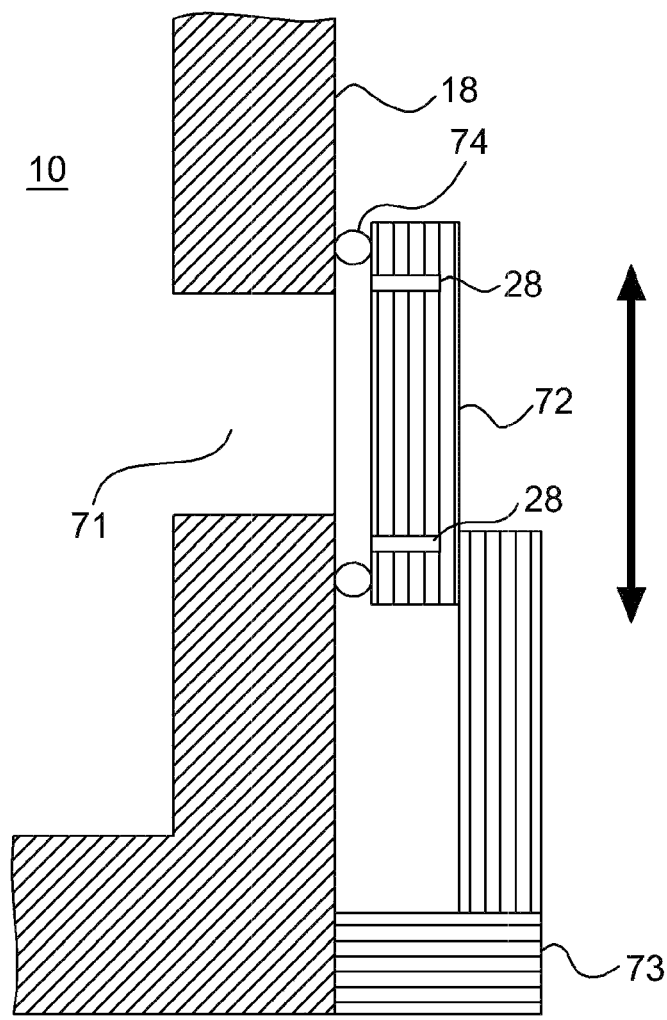
FIG. 14 is a vertical sectional view of a substrate processing apparatus according to a third modification of the second embodiment of the present invention, in which the vicinity of a gate valve is illustrated.

FIG. 14 is a vertical sectional view of the substrate processing apparatus 400 according to the third modification of the second embodiment, in which the vicinity of a gate valve 72 is illustrated.

In the substrate processing apparatus 400 according to the third modification of the second embodiment, choke groove 28 serving as a groove structure, is formed in a side of a gate valve 72 facing a process chamber 10 and an inner side of a sealing part 74. Similarly, according to the second embodiment, microwaves may be prevented from leaking and the sealing part 74 may be prevented from burning out, thereby increasing the efficiency of processing the wafer 11.

Similar to the substrate processing apparatus 100 according to the first embodiment, the choke groove 28 used in the substrate processing apparatus 400 according to the third modification of the second embodiment are preferably formed to a depth D that is less than or equal to a ¼ wavelength (λ/4) of microwaves. Thus, microwave cancellation is maximized at the choke groove 28 to increase the effect of preventing microwaves from leaking. In addition, the choke groove 28 may be filled with a dielectric material. Thus, size of the apparatus may be minimized and particles may be prevented from flowing into and accumulating in the choke groove 28. As the dielectric material to be filled into the choke groove 28, for example, a material having a high dielectric constant, such as SiO2 (silicon dioxide), Al2O3 (aluminum oxide), SiN (silicon nitride), AlN (aluminum nitride), etc., may be used.

According to the present embodiment, electromagnetic waves may be confined in a space above the wafer 11 and the wafer 11 may thus be efficiently processed. In addition, electromagnetic waves may be prevented from propagating to a sealing part such as an O-ring, thereby preventing the sealing part from burning out and deteriorating. In addition, electromagnetic waves may be controlled to decline at a side surface of a substrate mounting unit to be prevented from propagating to a rotational elevating mechanism, thereby preventing a malfunction of the rotational elevating mechanism. In addition, even if particles are generated and accumulate in the choke groove, the particles may be suppressed from flowing into a space which is a process space above the wafer 11, thereby preventing the wafer 11 from being polluted.

Also, according to the present embodiment, a distribution of an electromagnetic field in a process chamber that includes a process container and a substrate mounting unit may be changed by adjusting the height of the substrate mounting unit, and thus a desired distribution of the electromagnetic field may be achieved. That is, although the substrate mounting unit is moved upward/downward so as to achieve the desired distribution of the electromagnetic field, electromagnetic waves may be prevented from leaking and an effect obtained when the structure of choke is used may be maintained.

Third Embodiment

The inventors of the present application conducted further research and found that a substrate processing apparatus, a substrate supporting device and a substrate processing method capable of suppressing an increase in temperature of a substrate to suppress a thermal budget and decreasing a thermal load on the substrate by covering the wafer 11 serving as the substrate with a conductive cover so as to improve the in-plane uniformity of the substrate may be provided.

The structure of a substrate processing apparatus according to a third embodiment of the present invention will be described with reference to FIGS. 16 to 20 below.

Figure 16:
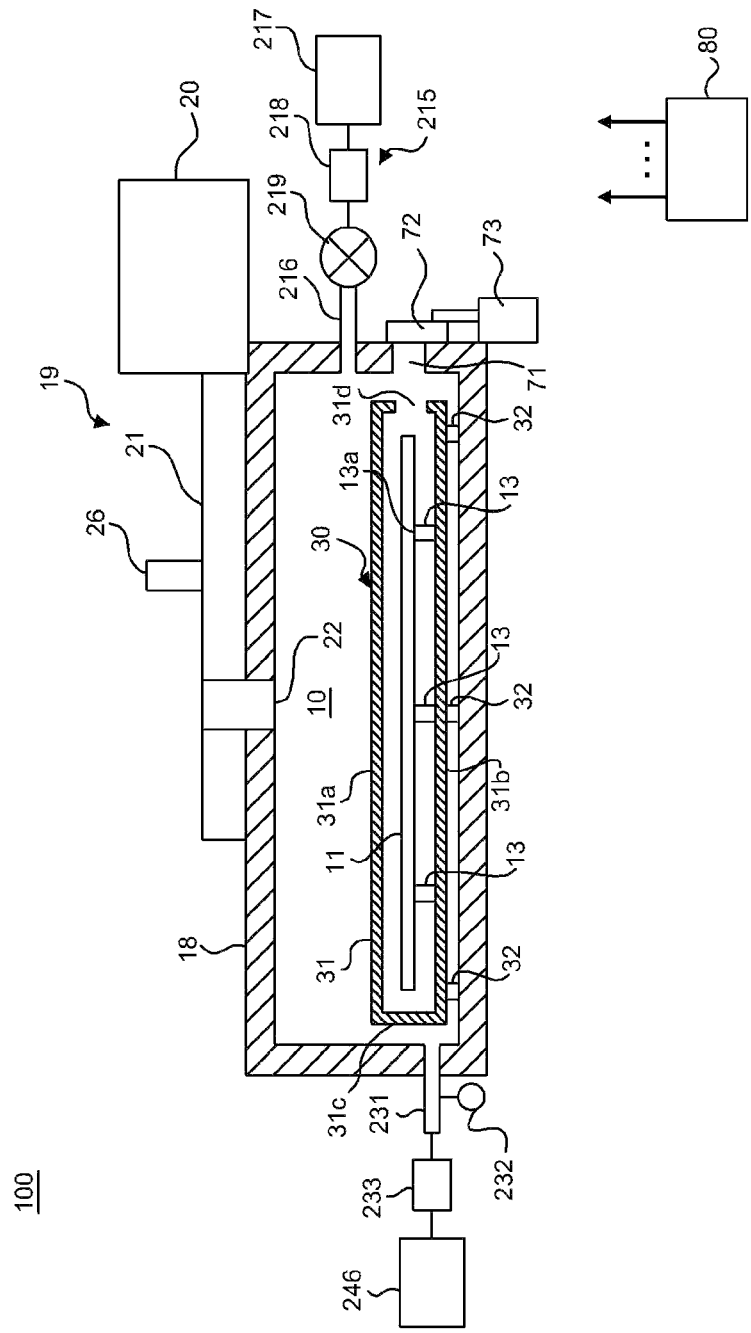
FIG. 16 is a vertical sectional view of a substrate processing apparatus according to a third embodiment of the present invention.

The structure of a substrate processing apparatus 100 according to the third embodiment of the present invention will now be described with reference to FIG. 16. FIG. 16 is a vertical sectional view of the substrate processing apparatus 100 according to the third embodiment of the present invention. The substrate processing apparatus 100 includes a process chamber 10, a transfer chamber (not shown) and a microwave supply unit 19. The process chamber 10 is configured to process a wafer 11 serving as a semiconductor substrate. The microwave supply unit 19 includes a waveguide 21 and a waveguide opening 22. A microwave generator 20 may be further installed on the microwave supply unit 19.

The microwave generator 20 generates, for example, fixed-frequency microwaves or variable-frequency microwaves. For example, a microtron, a klystron, a gyrotron, etc. may be used as the microwave generator 20. Microwaves generated by the microwave generator 20 are radiated into the process chamber 10 through the waveguide opening 22, which communicates with the inside of the process chamber 10, via the waveguide 21. Thus, the efficiency of dielectric heating may be improved. A matching mechanism 26 is installed on the waveguide 21 to decrease the amount of power reflected in waveguide 21.

The microwaves supplied into the process chamber 10 are radiated roughly vertically toward a bottom surface of a conductive cover 31 (which will be described below) from a top surface of the conductive cover 31. Microwaves having a frequency of 1 GHz to 100 GHz are radiated to an external side of the conductive cover 31 in the process chamber 10 that is electrically blocked. That is, the microwaves radiated to the conductive cover 31 are absorbed by the conductive cover 31 and thus the wafer 11 is dielectrically heated by the microwaves.

The microwave generator 20, the waveguide 21, the waveguide opening 22 and the matching mechanism 26 form the microwave supply unit 19.

A process container 18 that forms the process chamber 10 is formed of, for example, a metal material such as aluminum (Al) or stainless steel (SUS) to provide a shield for the process chamber 10 from microwaves.

A substrate support unit 30 that supports the wafer 11 is installed in the process chamber 10. The substrate support unit 30 includes substrate support pins 13 which are a substrate support mechanism for supporting the wafer 11 on top surfaces 13a thereof, and the conductive cover 31 installed to cover the wafer 11 supported by the substrate support pins 13.

The substrate support pins 13 are formed of, for example, a material having a low electro-thermal property and a high electrically insulating property, such as quartz, a ceramic, sapphire, or Teflon (registered trademark), etc. By forming the substrate support pins 13 of such a material, the substrate support pins 13 may be suppressed from being heated and heat may be suppressed from leaking from the wafer 11 to the substrate support pins 13. Since the heat can be suppressed from leaking, the surface of the wafer 11 may be uniformly heated. In addition, the substrate support pins 13 are prevented from thermal deformation by heating, thereby controlling the heights of wafers to be the same. Accordingly, wafers in each slot may be heated reproducibly. In addition, a plurality of the substrate support pins 13 (three substrate support pins 13 in the present embodiment) are used.

The conductive cover 31 is formed of a conductive material. In addition, the conductive cover 31 includes a top surface cover 31a covering a top surface of the whole wafer 11, a bottom surface cover 31b covering a bottom surface of the wafer 11, and a side surface cover 31c covering a side surface of the wafer 11, and is formed in a cylindrical shape, the size of which is equal to or greater than the size of the wafer 11 so that the whole wafer 11 is covered. An opening 31d is formed in a surface of the conductive cover 31 facing a wafer loading port 71 which will be described below. The whole conductive cover 31 is formed to have the same electric potential. Thus, over-currents formed on the conductive cover 31 may be uniformized to improve the in-plane uniformity of a film formed on the wafer 11.

That is, a substrate to be processed is entirely accommodated in a conductor, the size of which is equal to or greater than the size of the substrate so that it is not electrically closed, and microwaves having a frequency of 1 GHz to 100 GHz are radiated to the substrate.

Although the case in which microwaves are supplied via the top of the conductive cover 31 has been described above in the present embodiment, microwaves may be supplied via the bottom of the conductive cover 31 or via both the top and bottom of the conductive cover 31. When microwaves are radiated via top and bottom surfaces of the conductive cover 31, the efficiency of dielectric heating may be increased.

Also, the inside of the conductive cover 31 may be filled with an insulating material such as SiO2 (silicon dioxide). In this case, the processing uniformity of the wafer 11 may be enhanced.

Here, the substrate support pins 13 and the conductive cover 31 form the substrate support unit 30.

Leg units 32 are installed at the bottom surface of the substrate support unit 30. A plurality of the leg units 32 (three leg units 32 in the present embodiment) are used, and support the substrate support unit 30 in the process chamber 10.

A gas supply pipe 216 that supplies, for example, a gas such as nitrogen (N2) is installed at a sidewall of the process chamber 10. A gas supply source 217, a flow rate control device 218 that adjusts the flow rate of a gas and an opening/closing valve 219 that opens or closes a gas flow channel are sequentially installed at the gas supply pipe 216 from an upstream end. By opening/closing the opening/closing valve 219, a gas is supplied into the process chamber 10 via the gas supply pipe 216 or the supply of the gas into the process chamber 10 is stopped. The gas supplied via the gas supply pipe 216 is used to cool the wafer 11 or used as a purge gas to push out a gas or an atmosphere in the process chamber 10.

The gas supply pipe 216, the flow rate control device 218 and the opening/closing valve 219 form a gas supply unit 215. The flow rate control device 218 and the opening/closing valve 219 are electrically connected to a controller 80, and controlled by the controller 80. The gas supply source 217 may be further installed in the gas supply unit 215.

Referring to FIG. 16, for example, a gas discharge pipe 231 that exhausts a gas in the process chamber 10 is installed in a sidewall of the process chamber 10 which is a lower portion of the process container 18 (which is a rectangular parallelepiped). A vacuum pump 246 serving as an exhausting device and a pressure control valve 233 are installed at the gas discharge pipe 231 sequentially from the upstream end. A pressure in the process chamber 10 is adjusted to a predetermined value by adjusting the degree of opening of the pressure control valve 233.

The gas discharge pipe 231 and the pressure control valve 233 form a gas discharge unit. The pressure control valve 233 and the vacuum pump 246 are electrically connected to the controller 80 and controlled to perform pressure adjustment by the controller 80. The vacuum pump 246 may be further installed in the gas discharge unit.

Referring to FIG. 16, the wafer loading port 71 is installed in a side surface of the process container 18, via which the wafer 11 is transferred into or out of the wafer process chamber 10. A gate valve 72 is installed at the wafer loading port 71. When the gate valve 72 is opened by a gate valve driving unit 73, the inside of the process chamber 10 and the inside of the transfer chamber communicate with each other. The wafer loading port 71, the gate valve 72 and the gate valve driving unit 73 form a wafer transfer unit. In the transfer chamber, a transfer robot (not shown) that transfers the wafer 11 is installed. The transfer robot includes a transfer arm configured to support the wafer 11 when the wafer 11 is transferred. When the gate valve 72 is opened, the wafer 11 may be transferred between the inside of the process chamber 10 and the inside of the transfer chamber by the transfer robot.

Figure 17A:
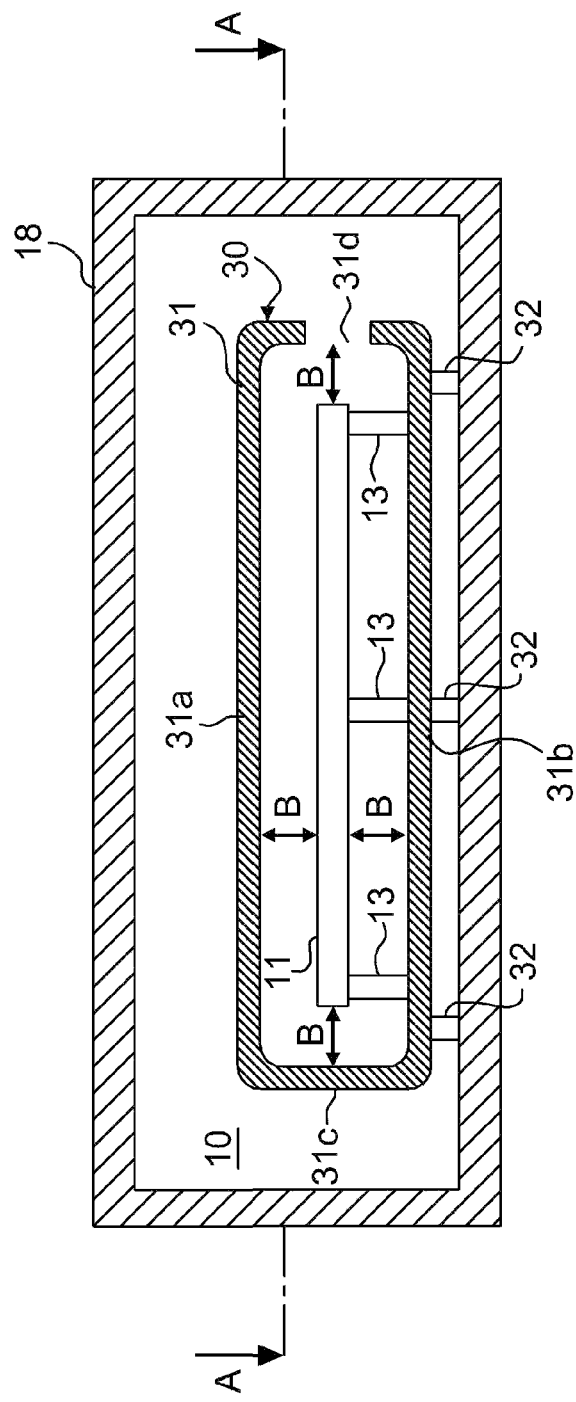

FIGS. 17A and 17B are diagrams illustrating the arrangement of a process chamber 10 and a conductive cover 31 included in a substrate processing apparatus 100 and a wafer 11 according to the third embodiment of the present invention. FIG. 17A is a vertical sectional view. FIG. 17B is a cross-sectional view taken along line A-A of FIG. 17A.

Substrate support pins 13 are installed such that the center of the wafer 11 supported by the substrate support pins 13, the center of the process chamber 10 and the center of the conductive cover 31 substantially coincide with one another in a vertical direction. Thus, the in-plane uniformity of the wafer 11 may be improved.

Also, the substrate support pins 13 are installed to have the wafer 11 placed thereon substantially parallel to a relative surface (an inner surface) of the conductive cover 31 facing the substrate support pins 13 so that the wafer 11 and the inner surface of the conductive cover 31 may not be electrically connected to each other. The wafer 11 is preferably processed at a position at which an interval (a gap B) between the wafer 11 and the inner surface of the conductive cover 31 is less than or equal to a ¼ wavelength ($\lambda/4$) of microwaves or is an odd multiple of the ¼ wavelength ($\lambda/4$). By setting the distance between the wafer 11 and the inner surface of the conductive cover 31 as described above, a high-frequency electric field at a surface of the wafer 11 is maximized and thus the energy of microwaves may be effectively incident on the surface of the wafer 11. In addition, end portions of the wafer 11 substrate may also be uniformly heated, thereby preventing a circuit formed on the wafer 11 from being damaged. In other words, influence of standing waves on the wafer 11 may be suppressed.

The substrate processing apparatus 100 is controlled by the controller 80 of FIG. 3 as described above in the first embodiment.

Figure 18:
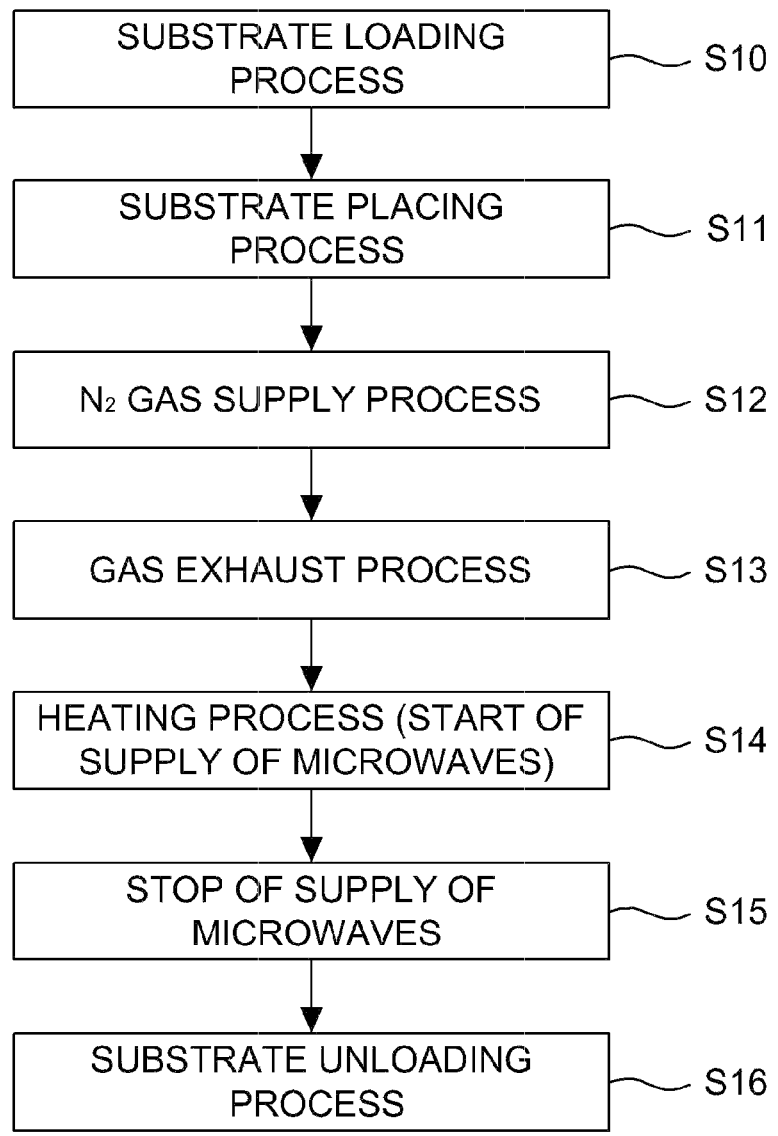
FIG. 18 is a flowchart illustrating a substrate processing process performed by the substrate processing apparatus according to the third embodiment of the present invention.

Next, substrate processing performed by the substrate processing apparatus 100 according to the present embodiment will be described. FIG. 18 is a flowchart illustrating a substrate processing process performed by the substrate processing apparatus according to the third embodiment of the present invention. The substrate processing according to the present embodiment is one of a plurality of processes performed to manufacture a semiconductor device. In addition, the operations of various components which will be described below are controlled by the controller 80.

Substrate Loading Process (Step S10)

In a substrate loading process of loading the wafer 11 into the process chamber 10, first, the gate valve 72 is opened to communicate the process chamber 10 and the transfer chamber with each other. Next, the wafer 11 to be processed (a substrate to be processed) is loaded from the transfer chamber into the process chamber 10 by the transfer robot.

Substrate Placing Process (Step S11)

The wafer 11 loaded in the process chamber 10 is placed on the top ends 13a of the substrate support pins 13 included in the conductive cover 31 via the opening 31d by the transfer robot, and is supported by the substrate support pins 13. Next, when the transfer robot returns into the transfer chamber from the inside of the process chamber 10, the gate valve 72 is closed.

Nitrogen Gas Supply Process (Step S12)

Next, an atmosphere in the process chamber 10 is replaced with a nitrogen (N2) atmosphere. When the wafer 11 is loaded into the process chamber 10, an air atmosphere outside the process chamber 10 flows into the process chamber 10 and thus the atmosphere in the process chamber 10 is replaced with the N2 atmosphere so that the process may not be influenced by moisture or oxygen contained in the air atmosphere.

Gas Exhaust Process (Step S13)

The opening/closing valve 219 is opened to supply N2 gas into the process chamber 10 via the gas supply pipe 216, and at the same time, a gas (atmosphere) in the process chamber 10 is discharged through the vacuum pump 246 via the gas discharge pipe 231 while a pressure in the process chamber 10 is adjusted to a predetermined value using the pressure control valve 233.

Although the N2 gas is used in the present embodiment, another gas having a high heat transfer rate, e.g., diluted helium (He) gas, may be added to the N2 gas so as to improve the effect of cooling the wafer 11, provided that the adding of the other gas does not cause any process and safety problems.

Heating Process (Start of Supply of Microwaves) (Step S14)

Next, microwaves generated by the microwave generator 20 are supplied into the process chamber 10 via the waveguide opening 22 to be radiated via a top surface of the conductive cover 31. The microwaves are set to have a desired frequency of 1 GHz to 100 GHz. Thus, over-current occurs in the conductive cover 31, and a film formed on the wafer 11 placed in the conductive cover 31 is heated by an electric field generated due to the over-current. As a result, the in-plane uniformity of the wafer 11 may be improved, and the efficiency of using microwaves or the efficiency of delivering the microwaves to the wafer 11 may be improved. In addition, in this case, the wafer 11 is retained at a position at which the distance between the wafer 11 and the inner surface of the conductive cover 31 is less than or equal to a ¼ wavelength ($\lambda/4$) of microwaves or is an odd multiple of the ¼ wavelength ($\lambda/4$). Thus, even end portions of the wafer 11 may be uniformly heated. By radiating the microwaves, a process of modifying a high-k film, i.e., a process of modifying the high-k film into a dense and stable insulating thin film to separate impurities such as carbon (C) or hydrogen (H) from the high-k film, is performed.

After the wafer 11 is heated by supplying microwaves thereto for a predetermined time, the supply of the microwaves is stopped (step S15).

Substrate Unloading Process (Step S16)

After the heating process ends, the heated wafer 11 is unloaded from the process chamber 10 into the transfer chamber in an order reverse to the order in which the substrate loading process described above was performed.

Modification of Third Embodiment

Figure 19:
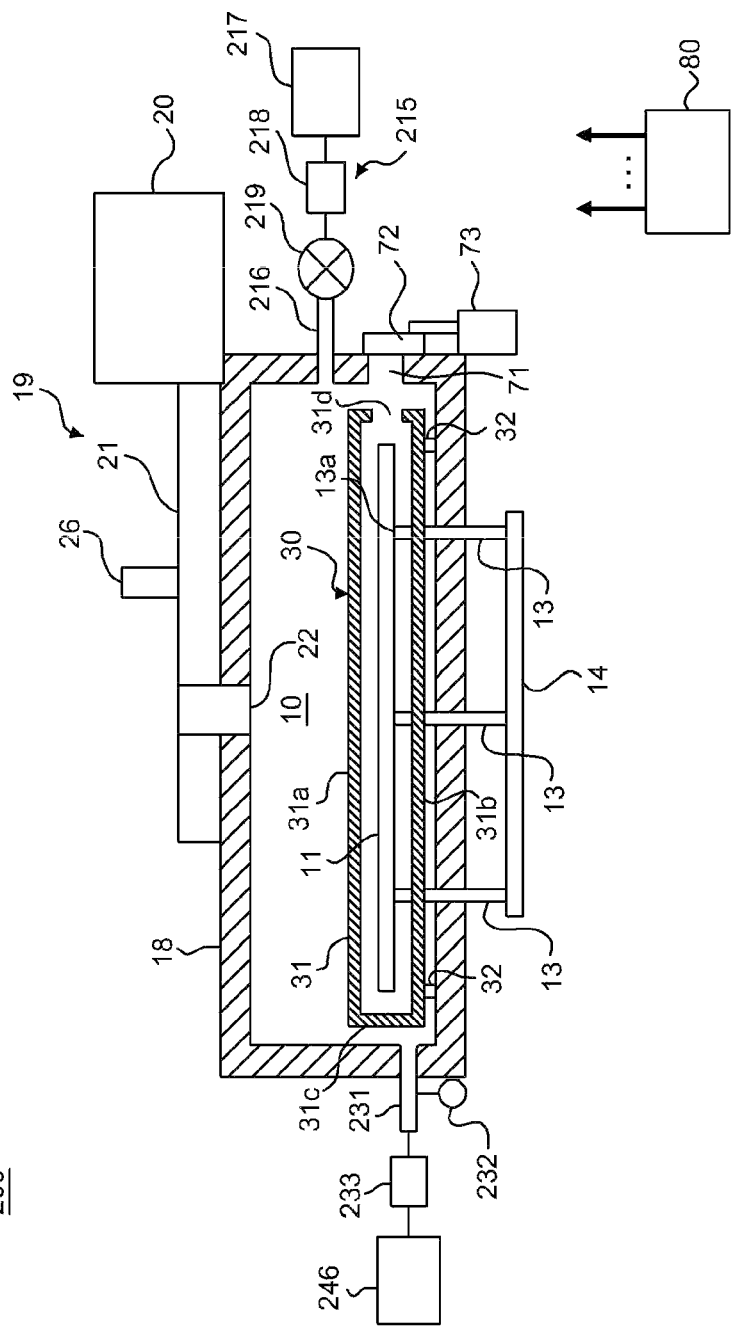
FIG. 19 is a vertical sectional view of a substrate processing apparatus according to a modification of the third embodiment of the present invention.

Next, a substrate processing apparatus 200 according to a modification of the third embodiment will be described with reference to FIG. 19 below. The substrate processing apparatus 200 according to the modification of the third embodiment has substantially the same structure as the substrate processing apparatus 100 according to the third embodiment, except for the structure of a substrate support unit 30.

In the substrate processing apparatus 200 according to the modification of the third embodiment, the substrate support unit 30 includes substrate support pins 13 and a conductive cover 31. The substrate support pins 13 are mounted on a pedestal 14 while passing through the conductive cover 31. The pedestal 14 includes a position control mechanism (not shown), and is configured to be moved upward/downward or to support the substrate support pins 13 at a specific position when the position control mechanism is controlled by a controller 80. When the pedestal 14 is moved upward/downward, the substrate support pins 13 may be moved upward/downward together with the pedestal 14.

The substrate support pins 13 may support a wafer 11, for example, at a position at which the distance between the wafer 11 and an inner surface of the conductive cover 31 is less than or equal to a ¼ wavelength (λ/4) of microwaves or is an odd multiple of the ¼ wavelength (λ/4). In other words, the distance between a substrate placing surface of the wafer 11 on top ends 13a of the substrate support pins 13 and the inner surface of the conductive cover 31 may be set to be less than or equal to the ¼ wavelength (λ/4) of the microwaves or to be an odd multiple of the ¼ wavelength (λ/4). By setting the distance as described above, the intensity of a high-frequency electric field on a surface of the wafer 11 may be maximized and thus the energy of microwaves may be efficiently incident on a surface of the wafer 11. In addition, since end portions of the wafer 11 may also be uniformly heated, a circuit formed on the wafer 11 may be prevented from being damaged. In other words, influence of standing waves on the wafer 11 may be suppressed.

Experimental Example

Figure 20:
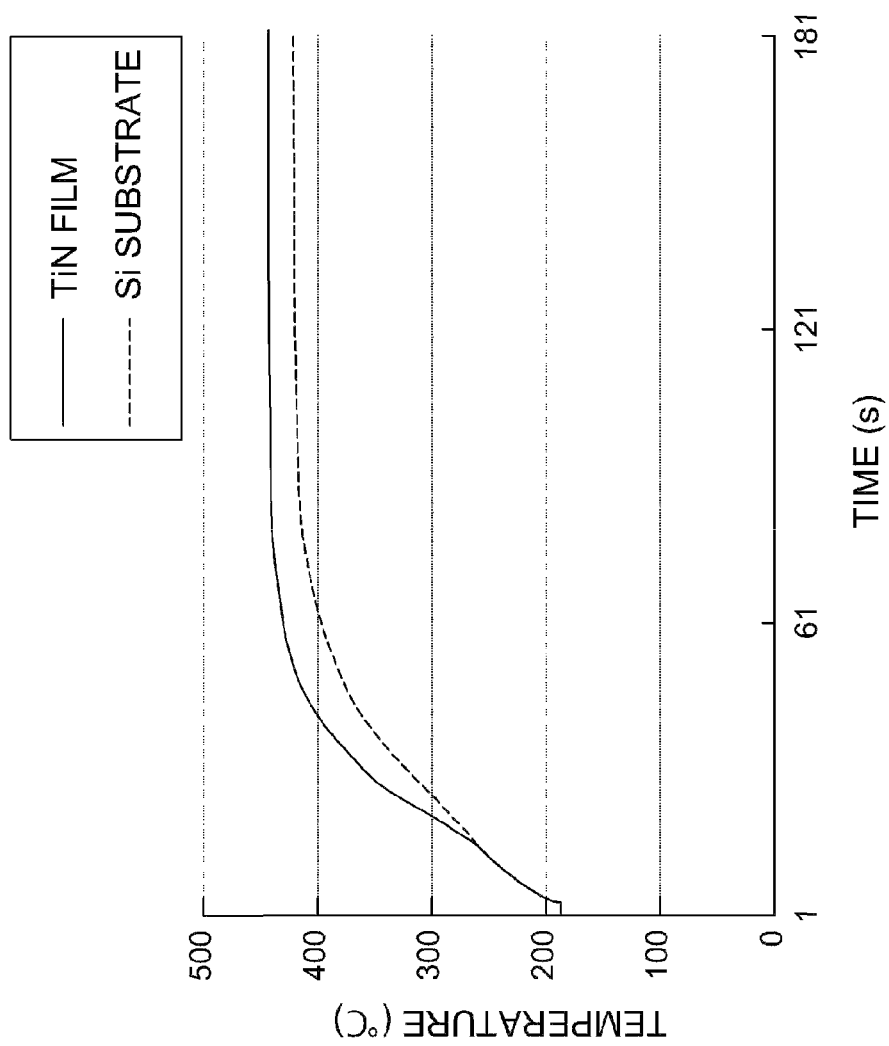
FIG. 20 is a graph illustrating an experimental example performed to evaluate a heating selectivity of microwaves on materials using a substrate processing apparatus according to the third embodiment of the present invention.

FIG. 20 is a graph illustrating an experimental example performed to evaluate a heating selectivity of microwaves on materials when the substrate processing apparatus 100 according to the third embodiment and the substrate processing apparatus 200 according to the modification of the third embodiment were used. FIG. 20 is a graph illustrating a result of performing a heating process using the substrate processing apparatus 100 according to the third embodiment and the substrate processing apparatus 200 according to the modification of the third embodiment, and directly measuring an increase in temperatures of a titanium nitride (TiN) film formed on a surface of the wafer 11 (a silicon (Si) substrate) and the back surface of the wafer 11 using a high-performance radiation thermometer [PhotriX®]. As illustrated in FIG. 20, the temperature of the TiN film formed on the surface of the wafer 11 became higher than the temperature of the wafer 11 (Si substrate) by about 20° C. Thus, it was noted that the wafer 11 was entirely and uniformly heated. That is, a film to be processed may be efficiently modified while the wafer 11 is constantly maintained at a temperature lower than a film reaction temperature, based on the heating selectivity of microwaves on materials.

Although the case in which a wafer on which a high-k film is formed is annealed (to control crystallization, decrease impurities, and compensate for deficiency of oxygen, etc.) has been described above in the present embodiment, the present invention is not limited thereto. The present invention is also applicable to activating impurities implanted into a bare silicon substrate, activating poly-Si and controlling a crystalline shape, curing a polymer, controlling a gain size of a Cu wiring, repairing a defect of Epi-Si or Epi-SiGe, or crystallizing an amorphous or poly structure. The substrate processing apparatus and the substrate manufacturing method according to the present invention are applicable to an LED manufacturing process to improve a crystal property of GaN.

Also, a plurality of fixed-frequency power sources may be installed, and microwaves of different frequencies may be alternately or simultaneously supplied from the plurality of respective fixed-frequency power sources.

According to the present embodiment, a film to be processed may be efficiently modified while reducing a thermal load on a substrate to be processed without increasing the substrate temperature and a process ambient temperature to a temperature substantially the same as a reaction temperature of the film, based on the heating selectivity of microwaves on materials. In addition, a thermal budget of the substrate may be suppressed to uniformly process the substrate, and deformation (e.g., distortion) of the substrate may be suppressed by decreasing a thermal load on the substrate. In addition, dielectric heating may be efficiently performed to efficiently modify a film to be processed. In addition, since a thin film formed on a surface of a substrate to be processed may be crystallized, the thin film into which, for example, positive or negative ions are implanted or positive and negative ions are mixedly implanted may be crystallized. In addition, residual organic impurities may be selectively removed from a CVD film formed of an organic material and on a substrate to be processed.

In addition to annealing, the present invention is also applicable to forming various films (such as an oxide film, a nitride film, or a metal film) by CVD, atomic layer deposition (ALD), physical vapor deposition (PVD), or the like; or performing other substrate processing methods such as diffusion, oxidation, nitridation, a lithographical treatment, etc. In addition to an annealing processing apparatus, the present invention is also applicable to other substrate processing apparatuses such as a thin film forming apparatus, an etching apparatus, an oxidizing apparatus, a nitridating apparatus, an exposure apparatus, an application apparatus, a molding apparatus, a developing apparatus, a dicing apparatus, a wire bonding apparatus, a drying apparatus, a heating apparatus, a test apparatus, etc. In addition, the present invention is applicable to a combination of the above apparatuses.

Also, although a single-wafer type substrate processing apparatus capable of processing one wafer 11 at a time has been described in the above embodiments, the present invention is not limited thereto. For example, the present invention is preferably applicable to various other substrate processing apparatuses such as a single-wafer type substrate processing apparatus capable of processing a plurality of wafers 11 at a time, a vertical type substrate processing apparatus, a horizontal type substrate processing apparatus, etc.

Also, the present invention is not limited to a semiconductor manufacturing apparatus capable of processing a semiconductor wafer (such as the substrate processing apparatus 100 according to the present embodiment), and is also applicable to various other substrate processing apparatuses, such as a liquid crystal display (LCD) manufacturing apparatus capable of processing a glass substrate, an apparatus capable of processing a photomask, a printed circuit board, a liquid crystal panel, a compact disc, a magnetic disk, etc.

With a substrate processing apparatus, a method of manufacturing a semiconductor device and a non-transitory computer-readable recording medium according to the present invention, a thermal budget may be lowered and an in-plane of a substrate may be uniformly heated.

Also, the above-described embodiments may be used in appropriate combinations.

Exemplary Embodiments of the Present Invention

Exemplary embodiments of the present invention will be supplementarily described below.

Supplementary Note 1

According to one aspect of the present invention, there is provided a semiconductor device manufacturing apparatus including: a process chamber configured to process a substrate; a substrate support unit configured to support the substrate; an electromagnetic wave radiation unit configured to radiate electromagnetic waves to the substrate; an auxiliary electromagnetic wave supply unit installed at a position spaced from the electromagnetic wave radiation unit in a direction of the diameter of the substrate; and a control unit configured to control at least the substrate support unit and the electromagnetic wave radiation unit.

Supplementary Note 2

In the apparatus of Supplementary note 1, preferably, the auxiliary electromagnetic wave supply unit is an electromagnetic wave diffusion unit that reflects the electromagnetic waves penetrating the substrate to be diffused toward the substrate.

Supplementary Note 3

In the apparatus of Supplementary note 1 or 2, preferably, the auxiliary electromagnetic wave supply unit includes at least one of an auxiliary circumferential supply unit configured to supply microwaves to a circumferential side of a back surface of the substrate and an auxiliary inner wall supply unit configured to supply the microwaves to a side of the substrate.

Supplementary Note 4

The apparatus of any one of Supplementary notes 1 through 3, preferably further includes an auxiliary central supply unit configured to supply the microwaves to the back surface of the substrate as a center.

Supplementary Note 5

In the apparatus of any one of Supplementary notes 1 through 4, preferably, the electromagnetic wave diffusion unit is installed to face the back surface of the substrate supported by the substrate support unit, and configured to diffuse the electromagnetic waves penetrating the substrate toward the back surface of the substrate.

Supplementary Note 6

In the apparatus of any one of Supplementary notes 1 through 5, preferably, the electromagnetic wave diffusion unit is configured to radiate the electromagnetic waves penetrating the substrate toward a region of the substrate other than a region of the substrate facing the electromagnetic wave radiation unit.

Supplementary Note 7

In the apparatus of any one of Supplementary notes 1 through 6, preferably, the electromagnetic wave diffusion unit is formed such that a distance between the substrate and the electromagnetic wave diffusion unit increases as at least a region of the electromagnetic wave diffusion unit facing the electromagnetic wave radiation unit is disposed to face a center of the electromagnetic wave radiation unit.

Supplementary Note 8

In the apparatus of any one of Supplementary notes 1 through 7, preferably, the electromagnetic wave diffusion unit includes a disk-shaped unit and a ring-shaped unit installed to surround the disk-shaped unit, wherein the disk-shaped unit and the ring-shaped unit are configured to form a gap in a region of the electromagnetic wave diffusion unit facing the electromagnetic wave radiation unit.

Supplementary Note 9

In the apparatus of any one of Supplementary notes 1 through 7, preferably, a plurality of concavo-convex structures are installed on a region of the electromagnetic wave diffusion unit facing the electromagnetic wave radiation unit.

Supplementary Note 10

In the apparatus of any one of Supplementary notes 1 through 9, preferably, a reflected electromagnetic wave radiation unit is installed at a sidewall of the process chamber to reflect reflected waves of the electromagnetic waves present in the process chamber toward a side surface of the substrate.

Supplementary Note 11

In the apparatus of any one of Supplementary notes 1 through 10, preferably, the electromagnetic wave diffusion unit and the reflected electromagnetic wave radiation unit are each formed of a conductive material.

Supplementary Note 12

In the apparatus of any one of Supplementary notes 1 through 11, preferably, the substrate support unit supports the substrate at a position at which a distance between the back surface of the substrate and a lowermost surface of the electromagnetic wave diffusion unit is an odd multiple of a ¼ wavelength of the electromagnetic waves radiated by the electromagnetic wave radiation unit at least while the electromagnetic waves are radiated by the electromagnetic wave radiation unit.

Supplementary Note 13

In the apparatus of any one of Supplementary notes 1 through 12, preferably, the electromagnetic wave radiation unit is installed at a position dislocated from a center of the substrate.

Supplementary Note 14

In the apparatus of any one of Supplementary notes 1 through 13, preferably, the substrate supported by the substrate support unit is configured to be rotatable, and the control unit controls the substrate supported by the substrate support unit to be rotated at least while the electromagnetic waves are radiated by the electromagnetic wave radiation unit.

Supplementary Note 15

In the apparatus of any one of Supplementary notes 1 through 14, preferably, the substrate support unit includes a plurality of substrate support mechanisms, wherein the plurality of substrate support mechanisms support the substrate at different heights at least while the electromagnetic waves are radiated by the electromagnetic wave radiation unit.

Supplementary Note 16

In the apparatus of any one of Supplementary notes 1 through 15, preferably, the electromagnetic wave diffusion unit is configured to be movable up and down, and the control unit controls the electromagnetic wave diffusion unit to continuously move the electromagnetic wave diffusion unit up and down at least while the electromagnetic waves are radiated by the electromagnetic wave radiation unit.

Supplementary Note 17

In the apparatus of any one of Supplementary notes 1 through 16, preferably, the control unit controls the electromagnetic wave diffusion unit to move the electromagnetic wave diffusion unit up and down at predetermined timings at least while the electromagnetic waves are radiated by the electromagnetic wave radiation unit.

Supplementary Note 18

The apparatus of any one of Supplementary notes 1 through 17, preferably further including a vacuum-exhaust device configured to vacuum-exhaust the inside of the process chamber, and wherein the control unit controls the vacuum-exhaust device to maintain the inside of the process chamber at a pressure that does not cause plasma to be generated at least while the electromagnetic waves are radiated by the electromagnetic wave radiation unit.

Supplementary Note 19

According to another aspect of the present invention, there is provided a substrate processing apparatus including: a process chamber configured to process a substrate; a substrate support unit configured to support the substrate; an electromagnetic wave radiation unit configured to radiate electromagnetic waves to the substrate; an auxiliary electromagnetic wave supply unit installed at a position spaced from the electromagnetic wave radiation unit in a direction of the diameter of the substrate; and a control unit configured to control at least the substrate support unit and the electromagnetic wave radiation unit.

Supplementary Note 20

According to another aspect of the present invention, there is provided a method of manufacturing a semiconductor device, the method including: (a) loading a substrate into a process chamber and placing the substrate on a substrate support unit to be supported by the substrate support unit; and (b) supplying electromagnetic waves to the substrate through an auxiliary electromagnetic wave supply unit installed at a position spaced from an electromagnetic wave radiation unit in a direction of the diameter of the substrate while radiating electromagnetic waves to the substrate, which is supported by the substrate support unit, by the electromagnetic wave radiation unit.

Supplementary Note 21

In the method of Supplementary note 20, preferably, in the step (b), the auxiliary electromagnetic wave supply unit is an electromagnetic wave diffusion unit that reflects the electromagnetic waves penetrating the substrate to be diffused toward the substrate.

Supplementary Note 22

In the method of Supplementary note 20 or 21, preferably, the step (b) includes rotating the substrate supported by the substrate support unit at least while the electromagnetic waves are radiated by the electromagnetic wave radiation unit.

Supplementary Note 23

In the method of any one of Supplementary notes 20 through 22, preferably, the step (b) includes supporting the substrate at different heights by a plurality of substrate support mechanisms included in the substrate support unit.

Supplementary Note 24

According to another aspect of the present invention, there is provided a substrate processing method including: loading a substrate into a process chamber and placing the substrate on a substrate support unit to be supported by the substrate support unit; and supplying electromagnetic waves to the substrate through an auxiliary electromagnetic wave supply unit installed at a position spaced from an electromagnetic wave radiation unit in a direction of the diameter of the substrate while radiating electromagnetic waves to the substrate, which is supported by the substrate support unit, by the electromagnetic wave radiation unit.

Supplementary Note 25

According to another aspect of the present invention, there is provided a program causing a computer to perform: loading a substrate into a process chamber and placing the substrate on a substrate support unit to be supported by the substrate support unit; and supplying electromagnetic waves to the substrate through an auxiliary electromagnetic wave supply unit installed at a position spaced from an electromagnetic wave radiation unit in a direction of the diameter of the substrate while radiating electromagnetic waves to the substrate, which is supported by the substrate support unit, by the electromagnetic wave radiation unit.

Supplementary Note 26

According to another aspect of the present invention, there is provided a non-transitory computer-readable recording medium storing a program causing a computer to perform: loading a substrate into a process chamber and placing the substrate on a substrate support unit to be supported by the substrate support unit; and supplying electromagnetic waves to the substrate through an auxiliary electromagnetic wave supply unit installed at a position spaced from an electromagnetic wave radiation unit in a direction of the diameter of the substrate while radiating electromagnetic waves to the substrate, which is supported by the substrate support unit, by the electromagnetic wave radiation unit.

Supplementary Note 27

According to another aspect of the present invention, there is provided a substrate processing apparatus including: a process chamber configured to have a substrate loaded therein or unloaded therefrom; an electromagnetic wave supply unit configured to supply electromagnetic waves into the process chamber; a substrate mounting unit installed in the process chamber and configured to have the substrate placed thereon; a shutter installed in the process chamber; a sealing unit installed at the shutter; and a groove formed between a top surface of the substrate mounting unit and the sealing unit.

Supplementary Note 28

In the apparatus of Supplementary note 27, preferably, the groove is formed in a side surface of the substrate mounting unit.

Supplementary Note 29

In the apparatus of Supplementary note 27, preferably, the groove is formed in a portion of an inner wall of the process chamber facing a side surface of the substrate mounting unit.

Supplementary Note 30

In the apparatus of Supplementary note 28, preferably, a second groove is formed in a portion of an inner wall of the process chamber facing a side surface of the substrate mounting unit to not face the groove.

Supplementary Note 31

In the apparatus of any one of Supplementary notes 27 through 30, preferably, a depth of the groove is less than or equal to a ¼ wavelength of the electromagnetic waves supplied by the electromagnetic wave supply unit.

Supplementary Note 32

In the apparatus of any one of Supplementary notes 27 through 31, preferably, the groove is filled with a dielectric material.

Supplementary Note 33

According to another aspect of the present invention, there is provided a substrate processing method including: loading a substrate into a process chamber; placing the substrate on a substrate mounting unit; supplying electromagnetic waves to the substrate by an electromagnetic wave supply unit in a state in which a groove is formed between a top surface of the substrate mounting unit and a sealing unit installed in the process chamber; and unloading the substrate from the process chamber.

Supplementary Note 34

According to another aspect of the present invention, there is provided a method of manufacturing a semiconductor device, the method including: loading a substrate into a process chamber; placing the substrate on a substrate mounting unit; supplying electromagnetic waves to the substrate by an electromagnetic wave supply unit in a state in which a groove is formed between a top surface of the substrate mounting unit and a sealing unit installed in the process chamber; and unloading the substrate from the process chamber.

Supplementary Note 35

According to another aspect of the present invention, there is provided a program causing a computer to perform: loading a substrate into a process chamber; placing the substrate on a substrate mounting unit; supplying electromagnetic waves to the substrate by an electromagnetic wave supply unit in a state in which a groove is formed between a top surface of the substrate mounting unit and a sealing unit installed in the process chamber; and unloading the substrate from the process chamber.

Supplementary Note 36

According to another aspect of the present invention, there is provided a non-transitory computer-readable recording medium storing a program causing a computer to perform: loading a substrate into a process chamber; placing the substrate on a substrate mounting unit; supplying electromagnetic waves to the substrate by an electromagnetic wave supply unit in a state in which a groove is formed between a top surface of the substrate mounting unit and a sealing unit installed in the process chamber; and unloading the substrate from the process chamber.

Supplementary Note 37

According to another aspect of the present invention, there is provided a substrate mounting unit configured to have a substrate placed thereon, the substrate mounting unit including a groove formed in a sidewall thereof facing an inner wall of a process chamber in which the substrate mounting unit is accommodated.

Supplementary Note 38

According to another aspect of the present invention, there is provided a substrate processing apparatus including: a process chamber configured to process a substrate to be processed; a conductive cover installed in the process chamber and configured to cover the substrate to be processed; a gas supply unit configured to supply a process gas into the process chamber; an exhaust unit configured to exhaust a gas in the process chamber; and a microwave supply unit configured to supply microwaves to the conductive cover.

Supplementary Note 39

In the apparatus of Supplementary note 38, preferably, the conductive cover is configured to cover a top surface, a bottom surface, and side surfaces of the substrate to be processed.

Supplementary Note 40

In the apparatus of Supplementary note 38 or 39, preferably, the whole conductive cover has the same electric potential.

Supplementary Note 41

In the apparatus of Supplementary note 38, preferably, the conductive cover includes a top surface cover for covering a top surface of the substrate to be processed, a bottom surface cover for covering a bottom surface of the substrate to be processed, and a side surface cover for covering side surfaces of the substrate to be processed.

Supplementary Note 42

In the apparatus of Supplementary note 38, preferably, the conductive cover and the substrate to be processed are not in contact with each other.

Supplementary Note 43

In the apparatus of Supplementary note 38, preferably, the conductive cover is installed to be spaced from the substrate to be processed.

Supplementary Note 44

In the apparatus of Supplementary note 38, a distance between the conductive cover and the substrate to be processed is preferably less than or equal to a ¼ wavelength of the microwaves supplied into the process chamber, and is more preferably an odd multiple of the ¼ wavelength of the microwaves.

Supplementary Note 45

In the apparatus of any one of Supplementary notes 38 through 44, preferably, a center of the conductive cover and a center of the substrate to be processed coincide with each other.

Supplementary Note 46

In the apparatus of any one of Supplementary notes 38 through 45, preferably, the microwave supply unit is installed to supply microwaves to a top surface or a bottom surface of the conductive cover.

Supplementary Note 47

According to another aspect of the present invention, there is provided a semiconductor device manufacturing apparatus including: a process chamber configured to process a substrate to be processed; a conductive cover installed in the process chamber and configured to cover the substrate to be processed; a gas supply unit configured to supply a process gas into the process chamber; an exhaust unit configured to exhaust a gas in the process chamber; and a microwave supply unit configured to supply microwaves to the conductive cover.

Supplementary Note 48

According to another aspect of the present invention, there is provided a substrate supporting apparatus installed in a process chamber configured to process a substrate to be processed, and including therein a conductive cover configured to cover the substrate to be processed.

Supplementary Note 49

According to another aspect of the present invention, there is provided a substrate processing method including: loading a substrate to be processed into a process chamber; placing the substrate to be processed in a conductive cover installed in the process chamber to cover the substrate to be processed; supplying a process gas into the process chamber from a gas supply unit; exhausting a gas in the process chamber by a gas exhaust unit; and supplying microwaves to the conductive cover from a microwave supply unit.

Supplementary Note 50

According to another aspect of the present invention, there is provided a method of manufacturing a semiconductor device, the method including: loading a substrate to be processed into a process chamber; placing the substrate to be processed in a conductive cover installed in the process chamber to cover the substrate to be processed; supplying a process gas into the process chamber from a gas supply unit; exhausting a gas in the process chamber by a gas exhaust unit; and supplying microwaves to the conductive cover from a microwave supply unit.

Supplementary Note 51

According to another aspect of the present invention, there is provided a non-transitory computer-readable recording medium storing a program for performing a substrate processing method including: loading a substrate to be processed into a process chamber; placing the substrate to be processed in a conductive cover installed in the process chamber to cover the substrate to be processed; supplying a process gas into the process chamber from a gas supply unit; exhausting a gas in the process chamber by a gas exhaust unit; and supplying microwaves to the conductive cover from a microwave supply unit.

Supplementary Note 52

According to another aspect of the present invention, there is provided a program for performing a substrate processing method including: loading a substrate to be processed into a process chamber; placing the substrate to be processed in a conductive cover installed in the process chamber to cover the substrate to be processed; supplying a process gas into the process chamber from a gas supply unit; exhausting a gas in the process chamber by a gas exhaust unit; and supplying microwaves to the conductive cover from a microwave supply unit.

With a substrate processing apparatus, a semiconductor device manufacturing method and a non-transitory computer-readable recording medium according to the present invention, heating within a plane of a substrate may be uniform while a thermal budget is decreased.

What is claimed is:

1. A substrate processing apparatus comprising:
   a process chamber configured to accommodate a substrate;
   a substrate mounting unit installed in the process chamber and configured to have the substrate placed thereon, the substrate mounting unit comprising a choke groove disposed on a side surface thereof; and
   a microwave supply unit configured to supply microwaves to the substrate placed on the substrate mounting unit,
   wherein the microwave supply unit includes a microwave generator, a waveguide and a waveguide opening, the waveguide opening communicating with an inside of the process chamber, and
   wherein the choke groove comprises an upper inner surface and a lower inner surface facing each other, the upper inner surface and the lower inner surface are disposed along an outer circumferential direction of the substrate mounting unit and a depth of the choke groove from the side surface of the substrate mounting unit is equal to or less than one fourth of a wavelength of the microwaves supplied by the microwave supply unit.

2. The substrate processing apparatus of claim 1, further comprising a wafer loading port installed on a sidewall of the process chamber, and
   wherein the choke groove is positioned between the substrate placed on the substrate mounting unit and the wafer loading port.

3. The substrate processing apparatus of claim 1, further comprising:
   a wafer loading port installed on a sidewall of the process chamber; and
   a second choke groove disposed in an inner wall of the process chamber between the substrate placed on the substrate mounting unit and the wafer loading port.

4. The substrate processing apparatus of claim 3, wherein the second choke groove does not face the choke groove disposed on the side surface of the substrate mounting unit.

5. The substrate processing apparatus of claim 1, wherein the choke groove disposed on the side surface of the substrate mounting unit is filled with a dielectric material.

6. The substrate processing apparatus of claim 1, wherein the choke groove is disposed along an entire side surface of the substrate mounting unit.

7. The substrate processing apparatus of claim 3, further comprising: a shutter configured to seal the wafer loading port; and a third choke groove disposed in the shutter.

8. The substrate processing apparatus of claim 7, further comprising a sealing member installed in the shutter.

9. The substrate processing apparatus of claim 1, further comprising:
   an elevation mechanism configured to move the substrate mounting unit up and down; and
   a control unit configured to control the elevation mechanism to move the substrate mounting unit up and down.

10. A method of manufacturing a semiconductor device, comprising:
    (a) loading a substrate into a process chamber through a wafer loading port;
    (b) placing the substrate on a substrate mounting unit having a choke groove disposed on a side surface thereof;
    (c) moving the substrate mounting unit upward such that the choke groove is positioned higher than the wafer loading port; and
    (d) radiating microwaves generated by a microwave generator to the substrate via a waveguide and then through a waveguide opening communicating with an inside of the process chamber, and
    wherein the choke groove comprises an upper inner surface and a lower inner surface facing each other, the upper inner surface and the lower inner surface are disposed along an outer circumferential direction of the substrate mounting unit and a depth of the choke groove from the side surface of the substrate mounting unit is equal to or less than one fourth of a wavelength of the microwaves generated by the microwave generator.

11. The method of claim 10, wherein the process chamber comprises a second choke groove disposed in an inner wall of the process chamber above the wafer loading port, and
    wherein, in (c), the substrate mounting unit is moved upward such that the substrate on the substrate mounting unit is positioned higher than the second choke groove.

12. The method of claim 11, wherein, in (c), the substrate mounting unit is moved upward such that the choke groove disposed on the side surface of the substrate mounting unit does not face the second choke groove.

13. A non-transitory computer-readable recording medium causing a computer to perform:
(a) loading a substrate into a process chamber through a wafer loading port;
(b) placing the substrate on a substrate mounting unit having a choke groove disposed on a side surface thereof;
(c) moving the substrate mounting unit upward such that the choke groove is positioned higher than the wafer loading port; and
(d) radiating microwaves generated by a microwave generator to the substrate via a waveguide and then through a waveguide opening communicating with an inside of the process chamber, and
wherein the choke groove comprises an upper inner surface and a lower inner surface facing each other, the upper inner surface and the lower inner surface are disposed along an outer circumferential direction of the substrate mounting unit and a depth of the choke groove from the side surface of the substrate mounting unit is equal to or less than one fourth of a wavelength of the microwaves generated by the microwave generator.

14. The recording medium of claim 13, wherein the process chamber comprises a second choke groove disposed in an inner wall of the process chamber above the wafer loading port, and
wherein, in (c), the substrate mounting unit is moved upward such that the substrate on the substrate mounting unit is positioned higher than the second choke groove.

15. The recording medium of claim 14, wherein, in (c), the substrate mounting unit is moved upward such that the choke groove disposed on the side surface of the substrate mounting unit does not face the second choke groove.

* * * * *